(12) United States Patent
Kikuchi et al.

(10) Patent No.: US 9,453,874 B2
(45) Date of Patent: Sep. 27, 2016

(54) ACTUATOR, HANDLER APPARATUS AND TEST APPARATUS

(71) Applicant: ADVANTEST CORPORATION, Tokyo (JP)

(72) Inventors: Aritomo Kikuchi, Saitama (JP); Yuya Yamada, Gunma (JP); Masataka Onozawa, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 208 days.

(21) Appl. No.: 14/472,397

(22) Filed: Aug. 29, 2014

(65) Prior Publication Data

US 2015/0276852 A1 Oct. 1, 2015

(30) Foreign Application Priority Data

Mar. 25, 2014 (KR) .............. 2014-0034385

(51) Int. Cl.
  *G01R 31/28* (2006.01)
  *G01R 1/04* (2006.01)

(52) U.S. Cl.
  CPC ............... *G01R 31/28* (2013.01); *G01R 1/04* (2013.01); *G01R 1/0433* (2013.01); *G01R 31/2887* (2013.01); *G01R 31/2891* (2013.01); *G01R 31/2893* (2013.01)

(58) Field of Classification Search
  CPC .......... G01R 31/2851; G01R 31/2886; G01R 31/2893; G01R 31/2887; G01R 31/91; G01R 1/04; G01R 1/0433; G01R 31/28; H01L 21/67259; H01L 21/67276; H01L 21/681; H01L 21/67748; G01S 15/06; G01S 17/89; G01S 7/539; G05B 2219/39468; G05B 2219/40307; G05B 2219/43183; G05B 2219/45051; G05B 2219/45083; G05B 2219/49395

See application file for complete search history.

(56) References Cited

U.S. PATENT DOCUMENTS

| 5,240,548 A * | 8/1993 | Aramaki ............ G11B 23/0035 100/268 |
| 6,104,204 A * | 8/2000 | Hayama ............... G01R 1/0458 324/750.08 |
| 6,262,570 B1 | 7/2001 | Akaike et al. |
| 2010/0264907 A1 | 10/2010 | Mueller |
| 2011/0254945 A1* | 10/2011 | Kikuchi ............. G01R 31/2893 348/126 |
| 2013/0181734 A1 | 7/2013 | Horino et al. |

FOREIGN PATENT DOCUMENTS

| JP | 2001-208796 A | 8/2001 |
| JP | 2010-145361 A | 7/2010 |

* cited by examiner

*Primary Examiner* — Vinh Nguyen

(57) ABSTRACT

Provided is an actuator including: first to third rotation axes provided at a fixed section and having axes in a same direction, first to third rotation sections provided at positions offset from centers of the corresponding rotation axes, and rotating in response to the corresponding rotation axes; a movable section including first and third side walls facing the first and the third rotation sections in a first direction on a movable plane, and a second side wall facing the second rotation section in a second direction, the movable section moving on a predetermined movable plane in response to rotation of the first to third rotation sections; and a biasing section biasing the movable section with respect to the fixed section in at least one of the first direction and the second direction, and making at least one of the first to third rotation sections abut against the corresponding side wall.

13 Claims, 28 Drawing Sheets

ACTUATOR, HANDLER APPARATUS AND TEST APPARATUS

BACKGROUND

1. Technical Field

The present invention relates to an actuator, a handler apparatus, and a test apparatus.

2. Related Art

Conventionally, an actuator for adjusting the position of a device under test such as a semiconductor device with respect to a device holder in a handler apparatus conveying the device under test is known.

Patent Document 1: Japanese Patent Application Publication No. 2013-145140

A ball screw is one method to drive an actuator. However, a ball screw makes it difficult to reduce the size of the actuator.

SUMMARY

Therefore, it is an object of an aspect of the innovations herein to provide an actuator, a handler apparatus, and a test apparatus, which are capable of overcoming the above drawbacks accompanying the related art. The above and other objects can be achieved by combinations described in the claims. According to a first aspect related to the innovations herein, provided is an actuator for adjusting a position of a device under test, including: a fixed section; first, second, and third rotation axes provided at the fixed section and having axes in a same direction; first, second, and third rotation sections provided in correspondence to the first, second, and third rotation axes, provided at positions offset from centers of the corresponding rotation axes, and rotating in response to rotation of the corresponding rotation axes; a movable section including first and third side walls facing the first and the third rotation sections in a first direction on a predetermined movable plane, and a second side wall facing the second rotation section in a second direction different from the first direction, the movable section moving on the movable plane with respect to the fixed section in response to rotation of the first, second, and third rotation sections, and adjusting a position of the device under test; and a biasing section biasing the movable section with respect to the fixed section in at least one of the first direction and the second direction, and making at least one of the first, second, and third rotation sections abut against the corresponding side wall.

According to a second aspect related to the innovations herein, provided is a handler apparatus for conveying a device under test to a test socket, including: the actuator according to the first aspect, prior to causing a device holder holding the device under test to fit the test socket, adjusting a position of the device under test on the device holder; and a conveyer conveying the device holder on which the position of the device under test has been adjusted, to cause the device holder to fit the test socket.

According to a third aspect related to the innovations herein, provided is a test apparatus including the handler apparatus according to the second aspect for conveying the device under test to a test socket, the test apparatus testing the device under test and further including: a test head to be electrically connected to the device under test via the test socket; and a test module testing the device under test via the test head.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1A:
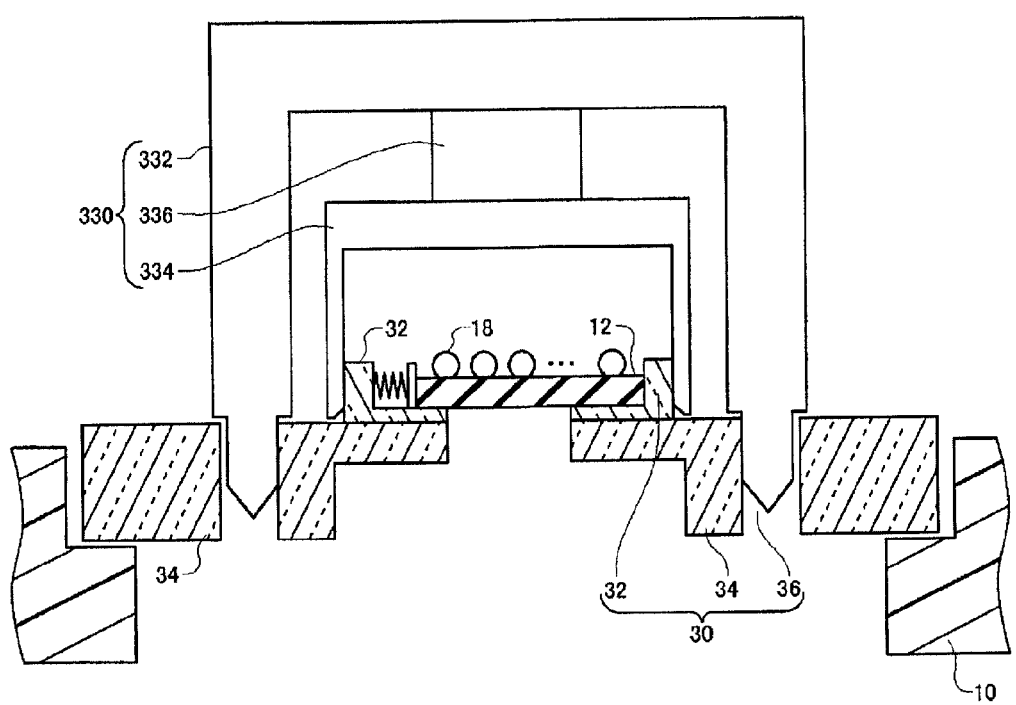
FIG. 1A shows an overview of an actuator 330 according to an embodiment.

FIG. 1A shows an overview of an actuator 330 according to an embodiment. For example, the actuator 330 is provided in a handler apparatus that conveys a device under test 12. The actuator 330 adjusts the position of the device under test 12 with respect to the device holder 30. The device under test 12 is a semiconductor chip, for example. A plurality of BGA electrodes 18 are provided on a surface of the device under test 12 in this example.

The device holder 30 in this example includes an inner unit 32, an outer unit 34, and a pin insertion section 36. The inner unit 32 holds a device under test 12. For example, the inner unit 32 fixes the device under test 12 by pressing it to a side wall using a spring or the like. In addition, the device holder 30 is conveyed by being mounted on a device tray 10.

The outer unit 34 holds the inner unit 32. The outer unit 34 in this example includes a lock mechanism for switching whether to lock the inner unit 32. The actuator 330 in this example adjusts the position of the device under test 12 with respect to the outer unit 34 by adjusting the position of the inner unit 32 with respect to the outer unit 34.

When adjusting the position of the device under test 12, the actuator 330 unlocks the inner unit 32 from the outer unit 34. The actuator 330 adjusts the relative position of the inner unit 32 and the outer unit 34, by moving at least one of the inner unit 32 and the outer unit 34 having unlocked from one another. After having adjusted the relative position, the actuator 330 locks the inner unit 32 to the outer unit 34.

The actuator 330 in this example includes an outer catch section 332, an inner catch section 334, and an actuator driving section 336. The outer catch section 332 grasps the outer unit 34. The outer catch section 332 in this example includes a pin inserted to the pin insertion section 36 of the device holder 30. The outer catch section 332 may grasp the outer unit 34 as well as unlocking it from the inner unit 32.

The inner catch section 334 grasps the inner unit 32. The actuator driving section 336 adjusts the relative position of the inner catch section 334 and the outer catch section 332, by moving at least one of the inner catch section 334 and the outer catch section 332. The actuator driving section 336 moves either one of the inner catch section 334 and the outer catch section 332 which is not fixed to the handler apparatus, with respect to the other which is fixed to the handler apparatus. The actuator 330 in this example adjusts the position of the device under test 12 accordingly.

Figure 1B:
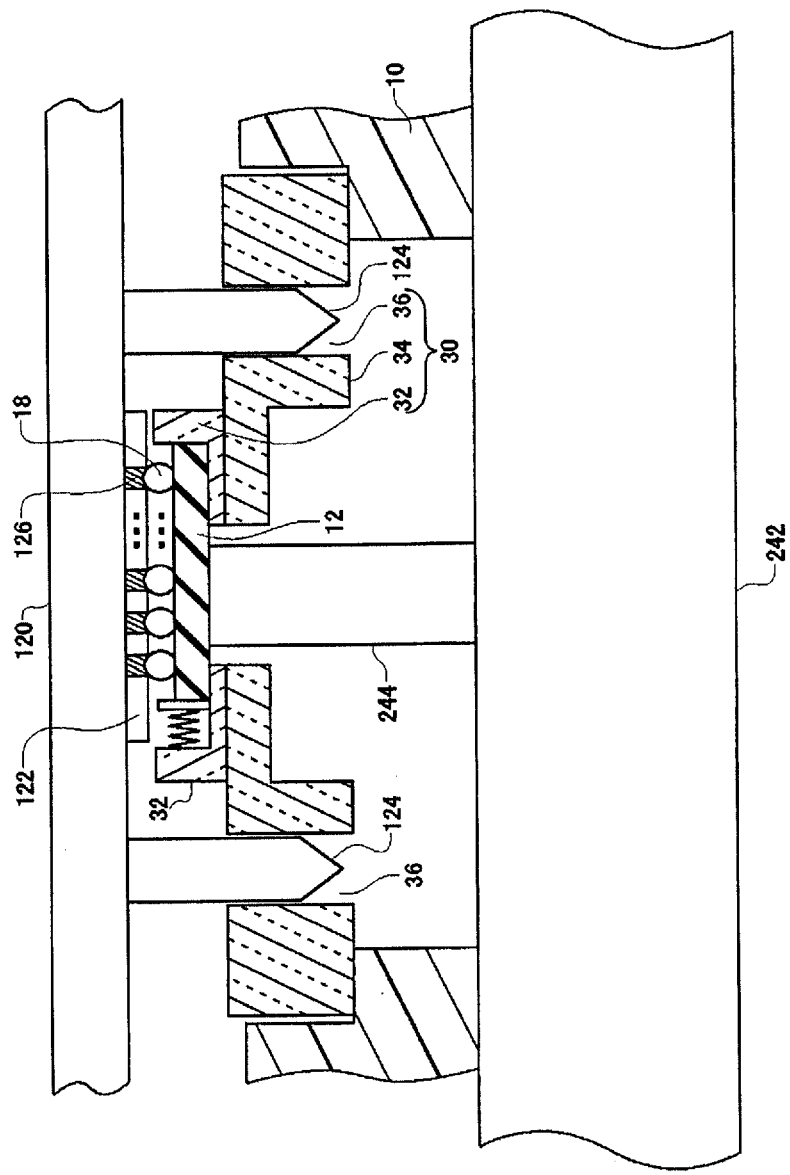
FIG. 1B shows an example of a device under test 12 connected to a test socket 122.

FIG. 1B shows an example of a device under test 12 connected to a test socket 122. The device under test 12 whose position has been adjusted by the actuator 330 is conveyed by a device mounting section 242, up to the vicinity of a socket board 120 provided with a test socket 122 of a test apparatus.

The test socket 122 in this example is provided for the socket board 120. The socket board 120 is provided with a socket pin 124 to be inserted into the pin insertion section 36 of the device holder 30. The device mounting section 242 conveys the device tray 10 to the vicinity of the socket board 120, so as to insert the socket pin 124 into the pin insertion section 36.

After the socket pin 124 is inserted in the pin insertion section 36, the pressing section 244 presses the device under test 12 towards the test socket 122. Accordingly, the device under test 12 is mounted to the test socket 122.

However, when the position of the device under test 12 is misaligned from the test socket 122, even if the device under test 12 is mounted to the test socket 122, the plurality of electrodes 18 of the device under test 12 will not be connected to the plurality of electrodes 126 of the test socket 122 with accuracy. In the state in which the device under test 12 is mounted to the test socket 122, the actuator 330 pre-aligns the device under test 12 with respect to the device holder 30, so that the plurality of electrodes 18 of the device under test 12 will be connected to the plurality of electrodes 126 of the test socket 122 with accuracy. For example, the actuator 330 pre-aligns the position of the device under test 12, based on the positional difference between the position of the plurality of electrodes 126 to the socket pin 124 and the position of the plurality of electrodes 18 to the pin insertion section 36.

Figure 2:
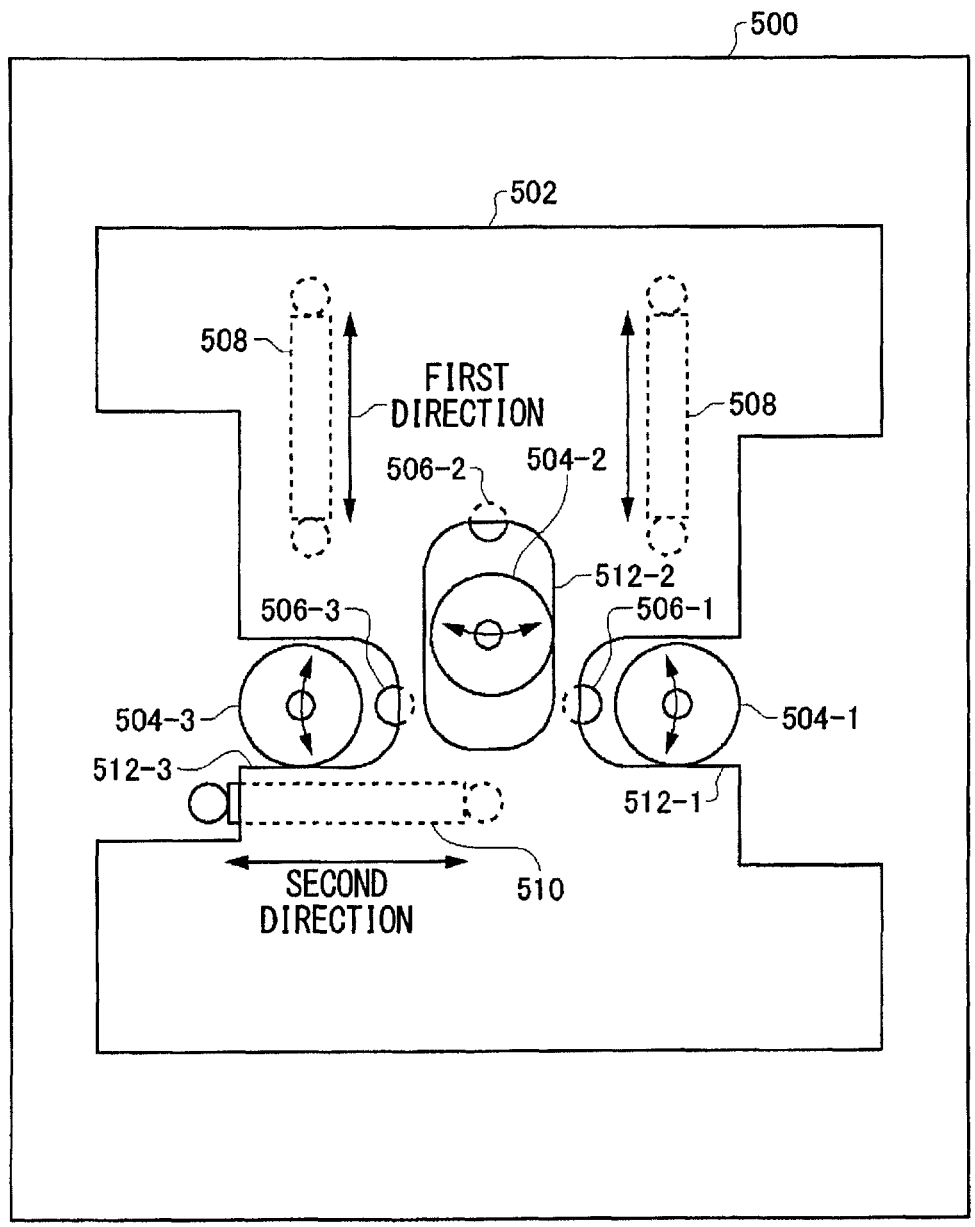
FIG. 2 shows an exemplary configuration of an actuator driving section 336.

FIG. 2 shows an exemplary configuration of an actuator driving section 336. The actuator driving section 336 includes a fixed section 500, a movable section 502, a first rotation section 504-1, a second rotation section 504-2, a third rotation section 504-3, a biasing section 508, and a biasing section 510. Note that, in the present specification, the first rotation section 504-1, the second rotation section 504-2, and the third rotation section 504-3 are referred to as a plurality of rotation sections 504. The plurality of rotation sections 504 may be a so-called cam follower.

The fixed section 500 is fixed to one of the outer catch section 332 and the inner catch section 334. In addition, the movable section 502 is fixed to the other of the outer catch section 332 and the inner catch section 334.

The fixed section 500 includes a first rotation axis 506-1, a second rotation axis 506-2, and a third rotation axis 506-3 having axes in the same direction. In the present specification, the first rotation axis 506-1, the second rotation axis 506-2, and the third rotation axis 506-3 are referred to as a plurality of rotation axes 506. The plurality of rotation axes 506 are provided on a facing surface of the fixed section 500, which faces the movable section 502. The plurality of rotation axes 506 in this example have axes vertical to the facing surface. The plurality of rotation axes 506 may be provided at positions each corresponding to a vertex of an isosceles triangle on the facing surface. More specifically, the first rotation axis 506-1 and the third rotation axis 506-3 may be provided at positions corresponding to both ends of the base of an isosceles triangle.

The plurality of rotation sections 504 are provided in correspondence with the plurality of rotation axes 506 on the facing surface of the fixed section 500. Each rotation section 504 is provided at a position offset by a predetermined distance from the center of a corresponding rotation axis 506. In addition, each rotation section 504 rotates according to the rotation of the corresponding rotation axis 506. Each rotation section 504 may not be movable along the entire periphery of a circle with the rotation axis 506 being the center. In other words, each rotation section 504 moves along a circle or an arc with the corresponding rotation axis 506 being the center, on a movable plane which is parallel to the facing surface of the fixed section 500.

The movable section 502 is provided to face the fixed section 500. In this example, the movable section 502 is in a plate form. The movable section 502 is provided to be movable with respect to the fixed section 500 on a movable plane which is parallel to the facing surface of the fixed section 500. In addition, the actuator driving section 336 may include a falling-off prevention mechanism that prevents the movable section 502 from falling off from the fixed section 500.

The movable section 502 includes a first side wall 512-1 and a third side wall 512-3 facing a first rotation section 504-1 and a third rotation section 504-3, in the first direction within the movable plane. In addition, the movable section 502 includes a second side wall 512-2 facing the second rotation section 504-2 in the second direction within the movable plane. In this example, the first direction is orthogonal to the second direction. In the present specification, the first side wall 512-1, the second side wall 512-2, and the third side wall 512-3 are referred to as a plurality of side walls 512.

The plurality of side walls 512 may be a part of the side wall of the opening formed through the movable section 502, or a part of the side wall of a notch formed at an edge of the movable section 502. The first side wall 512-1 and the third side wall 512-3 have a plane vertical to the first direction and to the movable plane. The second side wall 512-2 has a plane vertical to the second direction and to the movable plane.

So that the position of the rotation section 504 can be displaced with respect to the opening or to the notch, the opening or the notch has an area larger than the area of the rotation section 504 on the movable plane. In this example, the rotation section 504 has a circular sectional form on the movable plane. The movable section 502 has an opening having an oval form whose longer direction corresponds to the first direction, corresponding to the second rotation section 504-2. The length of the second direction (short direction) of the opening may be slightly larger than the diameter of the second rotation section 504-2. In addition, the movable section 502 includes notches whose longer direction corresponds to the second direction, corresponding to the first rotation section 504-1 and the third rotation section 504-3. The notches may have a partially oval form. The length of the first direction of the notches may be slightly larger than the diameter of the first rotation section 504-1 and the third rotation section 504-3.

According to the described structure, the movable section 502 moves with respect to the fixed section 500 within a predetermined movable plane, in accordance with the rotation of the plurality of rotation sections 504. As the movable section 502 moves with respect to the fixed section 500, the relative position between the outer catch section 332 and the inner catch section 334 changes, to adjust the position of the device under test 12. In addition, by using the rotation section 504 and the movable section 502, it becomes possible to reduce the size of the actuator 330.

The biasing section 508 and the biasing section 510 bias the movable section 502 with respect to the fixed section 500 in at least one of the first direction and the second direction. The biasing section 508 and the biasing section 510 in this example bias the movable section 502 with respect to the fixed section 500 in both of the first direction and the second direction. More specifically, the actuator driving section 336 includes two biasing sections 508 that bias the movable section 502 in the first direction and one biasing section 510 that biases the movable section 502 in the second direction. In a different example, the actuator driving section 336 may include a plurality of biasing sections 508 and biasing sections 510. The number of biasing sections 508 may be larger than the number of biasing sections 510.

The biasing sections 508 and the biasing section(s) 510 may cause at least one of the plurality of rotation sections 504 to abut against a corresponding side wall 512. The biasing sections 508 and the biasing section(s) 510 in this example causes all of the plurality of rotation sections 504 to abut against the corresponding side walls 512. The biasing sections 508 and the biasing section(s) 510 may be provided between the fixed section 500 and the movable section 502.

Each biasing section 508 is connected to the fixed section 500 at one end, and is connected to the movable section 502 at the other end, and includes a spring in the first direction that applies tension force between the fixed section 500 and the movable section 502 in the first direction. In addition, the biasing section(s) 510 is(are) connected to the fixed section 500 at one end, and connected to the movable section 502 at the other end, and includes a spring in the second direction that applies tension force between the fixed section 500 and the movable section 502 in the second direction. In addition, each spring may apply pressure between the fixed section 500 and the movable section 502.

Since the biasing sections 508 and the biasing section(s) 510 bias the movable section 502, the movable section 502 moves by keeping the state in which the plurality of side walls 512 are abut against the plurality of rotation sections 504. For this reason, even when the length in the shorter direction of the opening or the notch of the movable section 502 has a margin with respect to the diameter of the rotation section 504, the position of the rotation section 504 in the shorter direction within the opening or the notch can be made constant. Therefore, the position of the movable section 502 can be controlled with accuracy. The biasing sections 508 and the biasing section(s) 510 may preferably bias the movable section 502 so as to keep the state in which the plurality of rotation sections 504 abut against the plurality of side walls 512 in all the rotation angles and the positions that the movable section 502 can take.

Figure 3:
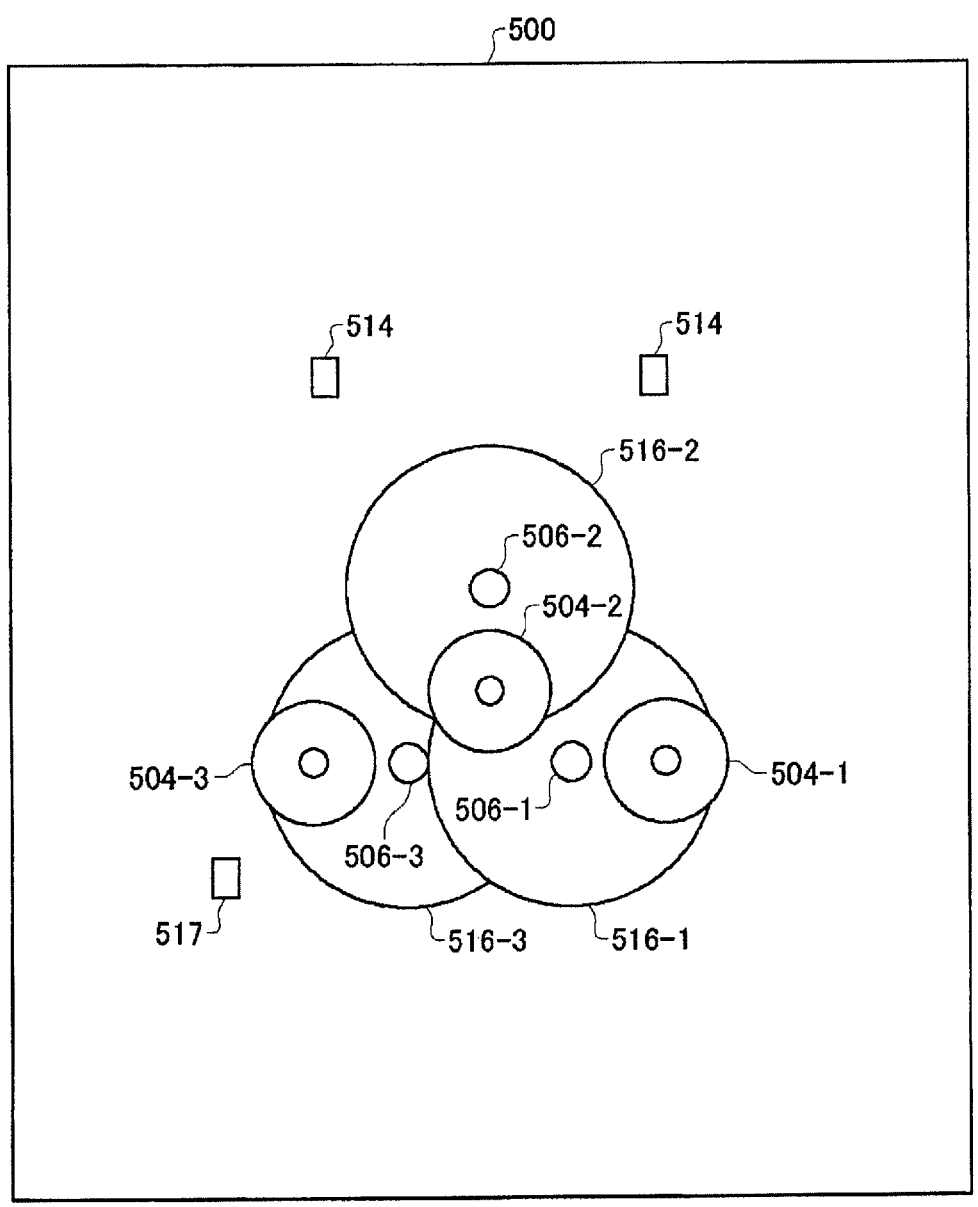
FIG. 3 shows an overview of a facing surface of a fixed section 500.

FIG. 3 shows an overview of a facing surface of a fixed section 500. The facing surface of the fixed section 500 is provided with two connecting sections 514 to which one end of the biasing section 508 is connected and one connecting section 517 to which one end of the biasing section 510 is connected. In addition, a first rotation disk 516-1, a second rotation disk 516-2, and a third rotation disk 516-3 are provided, which spins with the center being the rotation axis 506 according to the rotation of the rotation axis 506, around the plurality of rotation axes 506. In the present specification, the first rotation disk 516-1, a second rotation disk 516-2, and a third rotation disk 516-3 are referred to as a plurality of rotation disks 516.

Each edge of the plurality of rotation disks 516 is fixed to the corresponding rotation section 504. Accordingly, the rotation section 504 revolves with the rotation axis 506 being the center. Note that the plurality of rotation disks 516 are arranged so as not to interfere with each other. The plurality of rotation disks 516 may have a fan-like form so as not to be in contact with each other regardless of their rotation states. In addition, when the rotation disk 516 is in a disk form, they may be provided to be distant from each other within a plane, so as not to be in contact with one another, or may be provided to differ in position in the direction vertical to the plane. In addition, the rotation disk 516 may be a rod-like member to connect the rotation axis 506 and the rotation section 504.

Figure 4:
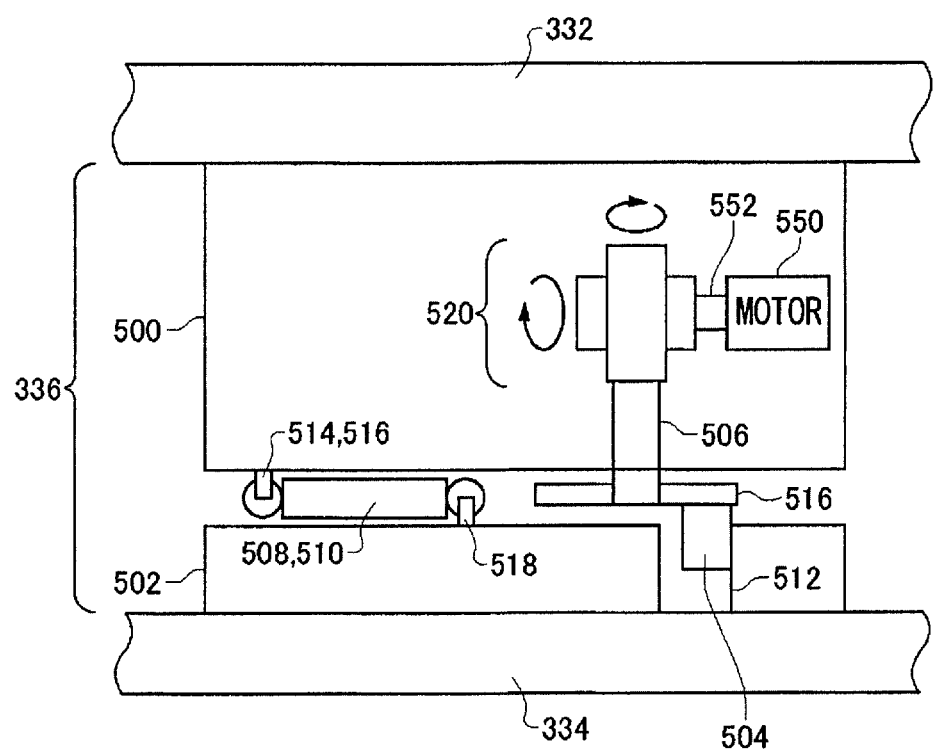
FIG. 4 shows an overview of an actuator driving section 336.

FIG. 4 shows an overview of an actuator driving section 336. FIG. 4 shows a sectional view of the actuator driving section 336. Note that one biasing section, one rotation section 504, one rotation disk 516, and one rotation axis 506 are illustrated in FIG. 4. In addition, a plurality of connecting sections 518 to be connected to a plurality of biasing sections are provided on the surface of the movable section 502 facing the fixed section 500.

In addition, the actuator driving section 336 includes first, second, and third motors 550 having a rotation axis 552 in a direction parallel to the movable plane of the movable section 502, and first, second, and third converting sections 520 provided to correspond to the first, second, and third motors 550. One motor 550 and one converting section 520 are illustrated in FIG. 4. One converting section 520 is provided to each one of the plurality of rotation axes 506.

The motor 550 rotates the rotation axis 552 based on a signal controlling the operation of the actuator 330. The converting section 520 rotates a corresponding rotation axis 506 by converting rotation of a corresponding motor 550 into rotation having axis in a direction vertical to the movable plane. The converting section 520 may be a worm wheel for example. According to the stated configuration, the size of the actuator 330 in the direction vertical to the movable plane can be further reduced.

The motor 550 and the converting section 520 may be provided inside the fixed section 500. The fixed section 500 may include a substrate facing the movable section 502, and a case section provided for the substrate, at the opposite side to the side of the movable section 502. The motor 550 and the converting section 520 are provided inside the case section. A surface of the case section at the opposite side to the side of the movable section 502 is fixed to one of the outer catch section 332 and the inner catch section 334. In addition, the surface of the movable section 502 at the opposite side to the side of the fixed section 500 is fixed to the other of the outer catch section 332 and the inner catch section 334.

Figure 5:
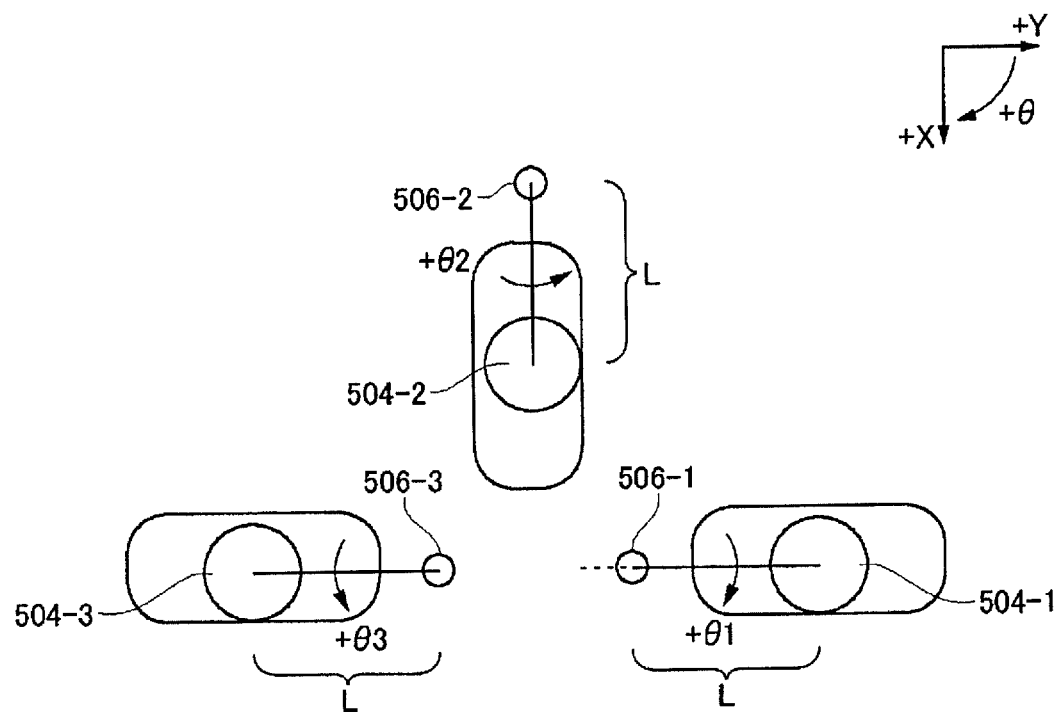
FIG. 5 shows an overview of an operation of the movable section 502.

FIG. 5 shows an overview of an operation of the movable section 502. In FIG. 5, a plurality of rotation axes 506, a plurality of rotation sections 504, and corresponding openings are illustrated. In FIG. 5, the first direction is X axis and the second direction is Y axis. The movable section 502 can move in X axis direction and Y axis direction according to rotation of the plurality of rotation sections 504, as well as rotating with the center being the predetermined stage original point (x0, y0) (movement in $\theta$ direction). In this example, as shown in FIG. 5, the position in Y axis direction of the second rotation section 504-2 is the center between the position of the first rotation axis 506-1 and the third rotation axis 506-3, and that the position of the second rotation section 504-2 when the distance from the second rotation section 504-2 to the first rotation axis 506-1 and the third rotation axis 506-3 is the shortest is the stage original point (x0, y0).

In the example of FIG. 5, the distance between the center of each rotation axis 506 and the center of the rotation section 504 is referred to as L. When the posture of the movable section 502 after being moved is determined, the posture of each opening is also determined. Then, the rotation section 504 moves along the circular orbit having a radius L with the rotation axis 506 being the center. Therefore, the amount of rotation $\theta 1$, $\theta 2$, $\theta 3$ of the rotation section 504 abutting against the side wall 512 after being moved can be obtained uniquely based on the position of each rotation axis 506, or the like. The amount of rotation $\theta 1$, $\theta 2$, $\theta 3$ will be the amount of rotation required to move the movable section 502 to the posture.

As described above, by controlling the amount of rotation of the plurality of rotation sections 504 so that the rotation sections 504 abut against the side wall 512 of the movable section 502 at the position to which the rotation sections 504 are desired to be moved, the movable section 502 can be moved in X axis direction, moved in Y axis direction, and rotated in $\theta$ direction. Note that to move the movable section 502 in X axis direction, the first rotation section 504-1 and the third rotation section 504-3 are rotated in the same amount without rotating the second rotation section 504-2. In addition, to move the movable section 502 in Y axis direction, the second rotation section 504-2 is rotated without rotating the first rotation section 504-1 or the third rotation section 504-3.

In addition, the handler apparatus obtains an image of the plurality of electrodes 18 of the device under test 12 and an image of the plurality of electrodes 126 of the test socket 122. Then, the actuator 330 adjusts the position of the device under test 12, based on the positional difference between the plurality of electrodes 18 and the plurality of electrodes 126. During this process, the handler apparatus instructs how much the movable section 502 of the actuator 330 should be moved in each of X axis, Y axis, and $\theta$ direction. Note that it is preferable to measure, in advance, how the movable section 502 of the actuator 330 actually moves, and to instruct the movable section 502 based on the measurement result.

Figure 6:
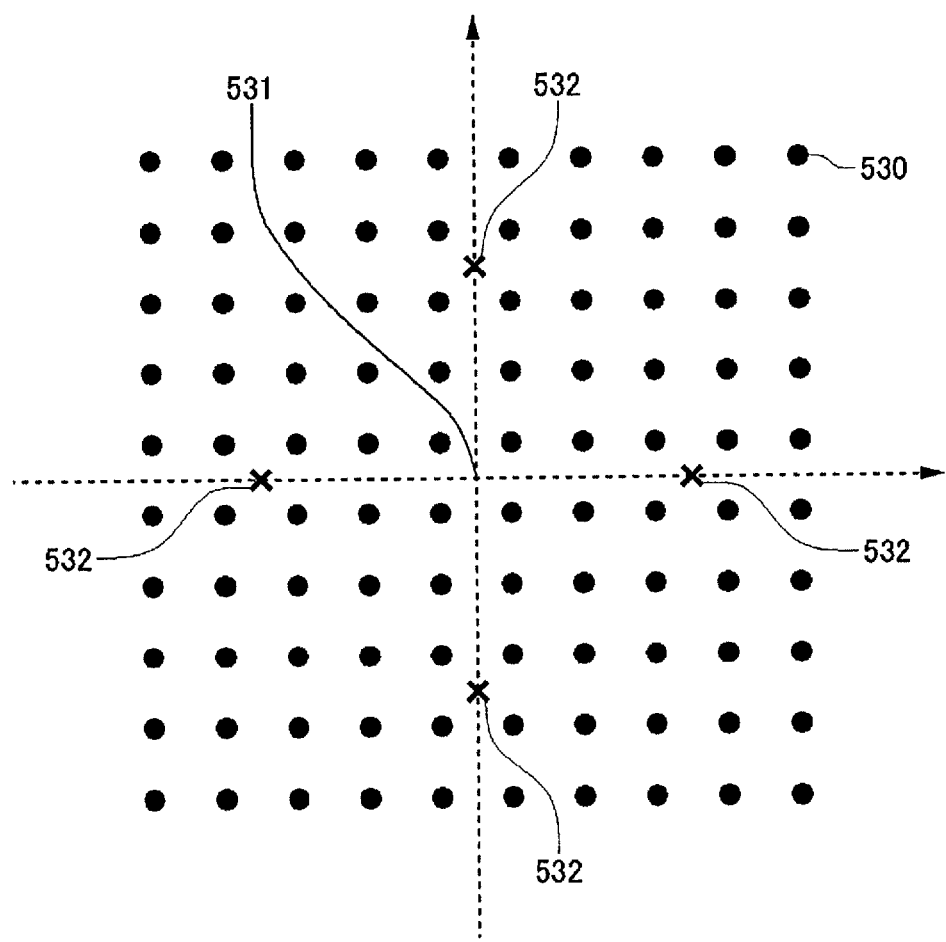
FIG. 6 shows a plurality of marks 530 provided for a driving portion of an inner catch section 334.

FIG. 6 shows a plurality of marks 530 provided for a driving portion of an inner catch section 334. The driving portion of the inner catch section 334 means a portion that moves in accordance with the movable section 502 and whose position with respect to the outer catch section 332 changes. The plurality of marks 530 may be provided on a surface of the driving portion of the inner catch section 334, which faces the device under test 12

The plurality of marks 530 are provided as a rectangular area. The intersection between the arrows in FIG. 6 indicates the central position 531 of the rectangular area. The actuator image-capturing section 326 described later captures an image of the actuator 330. The actuator image-capturing section 326 captures an image of an area including the plurality of marks 530. The actuator adjusting section 348 described later specifies the center of the rotation operation of the actuator 330, based on the image-capturing result captured by the actuator image-capturing section 326 while rotating the movable section 502.

In this example, the actuator adjusting section 348 measures the orbit of the four mark positions 532 specified by the plurality of marks 530. The four mark positions may be placed to be symmetrical on the two orthogonal axes, for example.

Note that the plurality of marks 530 are provided for the actuator 330 in this example. However, in a different example, the plurality of marks may be provided for the actuator fitting unit 410 described later. In this case, the actuator image-capturing section 326 rotates the actuator 330 while making the actuator fitting unit 410 fit the driving portion of the actuator 330 (for example, the driving portion of the inner catch section 334), and captures the image of the orbit of the marks 530. The plurality of marks 530 are provided on the surface of the actuator fitting unit 410 which faces the actuator image-capturing section 326.

Figure 7A:
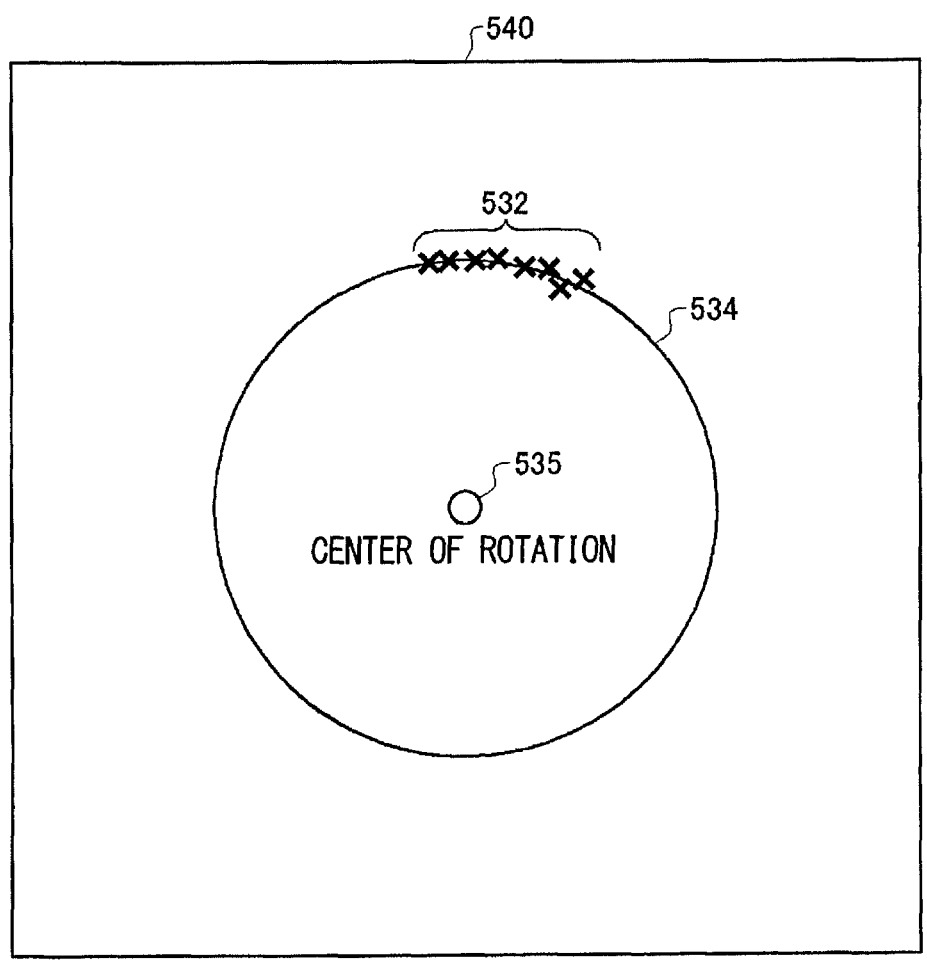
FIG. 7A shows an example of an orbit of one mark position 532 in an image 540 captured by an actuator image-capturing section 326.

FIG. 7A shows an example of an orbit of one mark position 532 in an image 540 captured by an actuator image-capturing section 326. The actuator image-capturing section 326 captures an image of the plurality of marks 530 while rotating the movable section 502 of the actuator 330. The actuator adjusting section 348 specifies the center of the rotation operation of the actuator 330, based on the orbit of the movement of the mark positions 532 in accordance with the rotation of the movable section 502. The actuator adjusting section 348 in this example detects the arc 534 approximating the orbit of the movement of the mark positions 532, thereby specifying the center 535 of the arc.

The actuator adjusting section 348 may detect the arc 534 approximating each of the mark positions 532, thereby specifying the center 535 of each arc. The actuator adjusting section 348 may specify the average position of the specified plurality of centers 535 as the center of rotation of the actuator 330. In addition, the actuator adjusting section 348 may detect the arc 534 approximating the orbit of two or more mark positions 532.

In addition, the actuator adjusting section 348 further detects, based on the image 540 captured by the actuator image-capturing section 326, how much the actuator 330 has actually rotated compared to the amount of rotation instructed to the actuator 330.

Figure 7B:
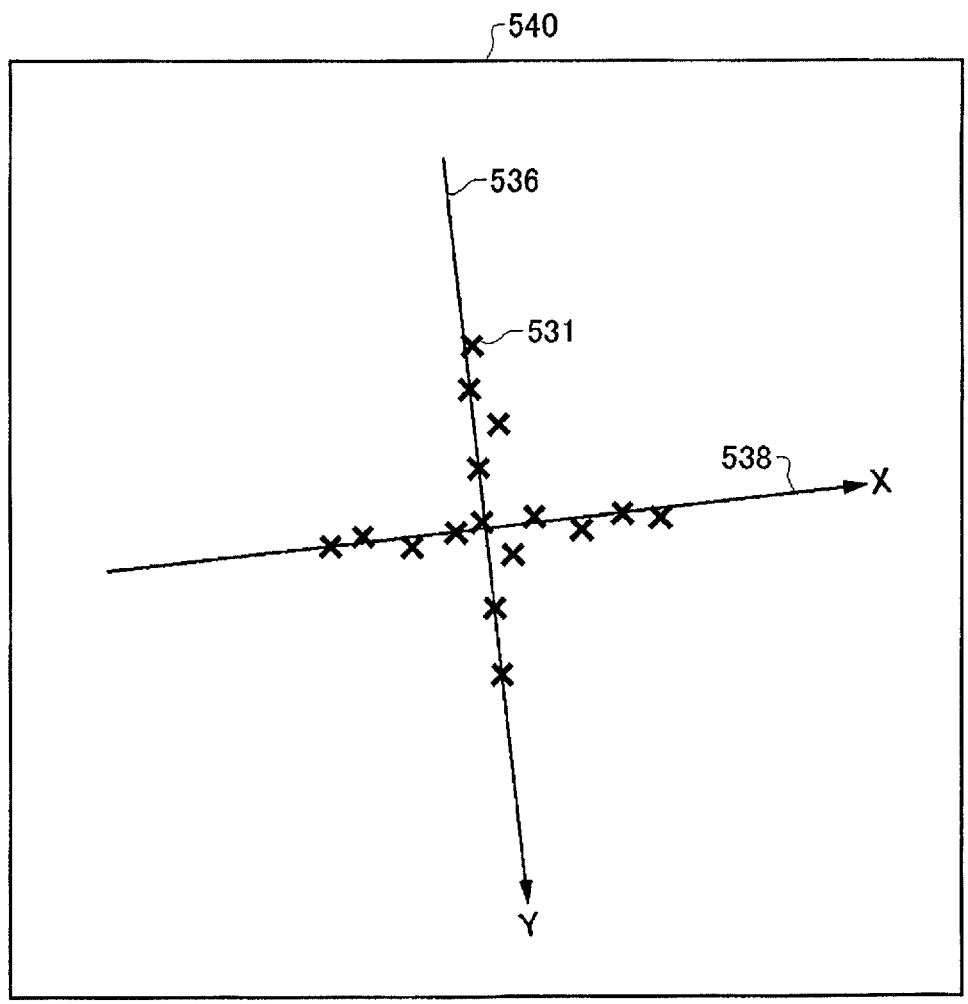
FIG. 7B shows an example of an orbit of a central position 531 in an image 540 captured by an actuator image-capturing section 326.

FIG. 7B shows an example of an orbit of a central position 531 in an image 540 captured by an actuator image-capturing section 326. The central position 531 can be specified from the position of the plurality of marks 530 in the image 540. FIG. 7B shows the image 540 when the movable section 502 has moved in response to the instruction to make parallel movement in a predetermined direction on the movable plane. The predetermined direction is X axis direction and Y axis direction, for example.

The actuator adjusting section 348 specifies the direction on the image 540 in which the actuator 330 moves in accordance with the instruction, based on the image-capturing result of the actuator image-capturing section 326. The actuator adjusting section 348 approximates the orbit along which the central position 531 has moved using the straight line 536 and the straight line 538, thereby specifying the direction in which the movable section 502 of the actuator 330 has actually moved. In addition, the actuator adjusting section 348 further detects how much the actuator 330 has actually moved compared to the amount of movement instructed to the actuator 330, based on the image 540 captured by the actuator image-capturing section 326.

According to the described process, the operation characteristic of the actuator 330 can be obtained. That is, how the actuator 330 operates in response to an instruction can be obtained, in the image 540 captured by the actuator image-capturing section 326. When adjusting the position of the device under test 12, the actuator adjusting section 348 gives an instruction to the actuator 330, based on the operation characteristic.

Accordingly, the position of the device under test 12 can be adjusted with accuracy. Generally speaking, the center of rotation of an actuator or the like is configured by a mechanical configuration value of the actuator. However, the actual center of rotation of an actuator has an error with respect to the configuration value attributed to a mechanical assembly error of the actuator or the like. On the contrary, the center of rotation of the actuator 330 in this example is specified by actually operating the actuator. Consequently, it is possible to specify the center of rotation of the actuator 330 with accuracy.

Figure 8:
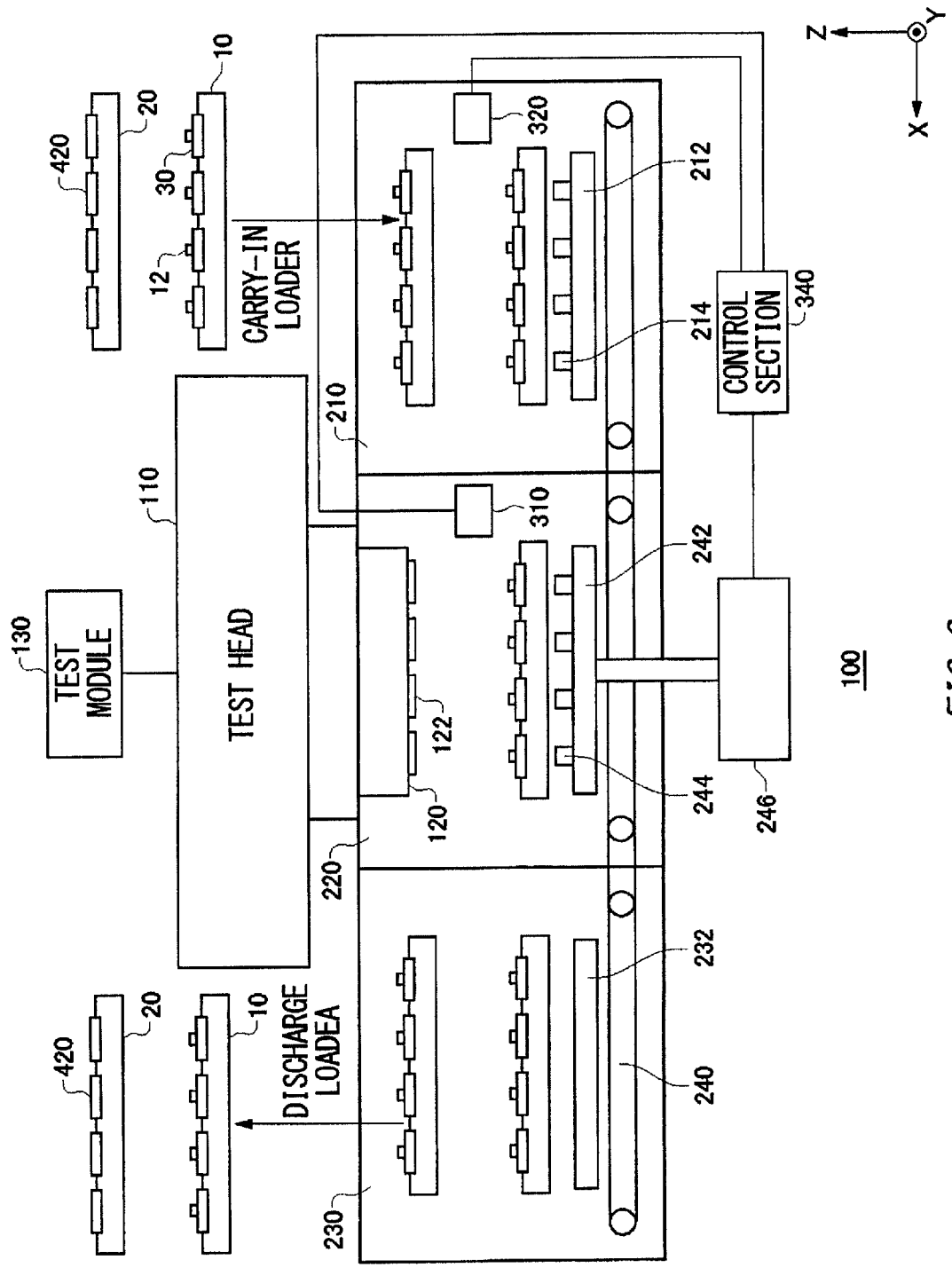
FIG. 8 shows an exemplary configuration of a handler apparatus 100 according to the present embodiment, together with a test head 110, a test module 130, a device tray 10, and a tray for adjustment 20.

FIG. 8 shows an exemplary configuration of a handler apparatus 100 according to the present embodiment, together with a test head 110, a test module 130, a device tray 10, and a tray for adjustment 20. Here, the test head 110 and the test module 130 are a part of the test apparatus testing the device under test 12. The handler apparatus 100 is connected to the test head 110. The handler apparatus 100 conveys a plurality of devices under test 12 to test sockets 122 provided in the test head 110, and electrically connects the devices under test 12 to the test sockets 122.

The test head 110 includes a socket board 120. The socket board 120 includes a plurality of test sockets 122. The test head 110 is electrically connected to each of the plurality of devices under test 12 via the plurality of test sockets 122. The test head 110 electrically connects the plurality of devices under test 12 connected to the plurality of test sockets 122, to the test module 130.

The test module 130 tests the devices under test 12 via the test head 110. The test module 130 inputs a test signal based on a test pattern for testing the plurality of devices under test 12, to each of the plurality of devices under test 12. The test module 130 determines good or bad of the plurality of devices under test 12 based on an output signal outputted from each of the devices under test 12 in response to the test signal.

The test apparatus tests a plurality of devices under test 12, such as an analog circuit, a digital circuit, analog/digital hybrid circuit, a memory, and a system on chip (SOC). Each of the plurality of devices under test 12 includes an electrode such as BGA (ball grid array) or an LGA (land grid array). Instead, the device under test 12 may include a terminal such as SOJ (small outline J-leaded), PLCC (plastic leaded chip carrier), QFP (quad flat package), or SOP (small outline package). A socket board 120 includes a test socket 122 electrically connectable to an electrode, a terminal, or the like included in a device under test 12 to be tested.

The handler apparatus 100 carries in the device tray 10 and the tray for adjustment 20 to inside. The handler apparatus 100 conveys the device under test 12 mounted to the device tray 10 carried in, by adjusting the position of the device under test 12, so as to connect the device under test 12 to the test socket 122. In addition, after the test apparatus has tested the device under test 12 carried in, the handler apparatus 100 discharges the device under test 12 to outside of the handler apparatus 100.

Here, the device tray 10 mounts thereon the device holder 30 holding the device under test 12. In an example, the device tray 10 include a plurality of device holders 30, so that one device under test 12 may be assigned one device holder 30. The handler apparatus 100 conveys the device under test 12 together with the device holder 30 to the test socket 122.

In an example, the device tray 10 and the device holder 30 are made of materials that would not cause any stress to the device under test 12 such as breaking, cracking, or deformation, even under temperature conditions adopted in high/low temperature tests executed by the test apparatus. In addition, the tray for adjustment 20 stores a socket fitting unit 420 or the like used in adjusting the position of the device under test 12. The device tray 10 and the tray for adjustment 20 are described later.

The handler apparatus 100 includes a heating section 210, a test section 220, a heat removing section 230, a conveyer 240, a test-socket image-capturing section 310, an actuator unit 320, and a control section 340.

The heating section 210 includes a carry-in loader. The carry-in loader loads the device tray 10 having mounted thereon the device holder 30, to inside the heating section 210. The heating section 210 controls the temperature of the device under test 12 to a predetermined test temperature, prior to the test in the test section 220. The handler apparatus 100 adjusts the position of the device under test 12 on each device holder 30, within the heating section 210. The heating section 210 may configure a chamber including an air-tight space in which the temperature, the atmosphere, or the like can be controlled. The heating section 210 includes a temperature control section 212.

The temperature control section 212 mounts thereon a device tray 10 carried in the heating section 210. The temperature control section 212 controls the temperature of a plurality of devices under test 12 held by the mounted device tray 10. The temperature control section 212 may mount thereon the device tray 10, by moving in Z direction going from the surface of the device tray 10 opposite to the surface on which the devices under test 12 are mounted towards the device tray 10. In an example, the temperature control section 212 controls the temperature of the plurality of devices under test 12 to be substantially equal to those under the temperature conditions of the test executed by the test apparatus according to the test program. Here, the temperature control section 212 may include a plurality of temperature control units 214.

In this example, a plurality of temperature control units 214 are provided to correspond to the maximum possible number of the devices under test 12 mountable on the device tray 10. Each temperature control unit 214 individually heats or cools the corresponding device under test 12 together with the device holder 30 from the backside. The backside of the device under test 12 is the surface opposite to the electrode surface or the terminal surface of the device under test 12 to be connected to the test socket 122. The temperature control unit 214 may be a thermoelement such as a Peltier element, or may be a cooler or a heater for circulating a cooling medium or a heat medium.

When each temperature control unit 214 directly controls the temperature of each device under test 12 from the backside of the device under test 12, the heating section 210 can control the temperature of the plurality of devices under test 12 rapidly and at low consumption power, without requiring accurate control of the temperature of the entire chamber. Alternatively, the temperature control section 212 may control the temperature of each device under test 12, by controlling the temperature of the entire chamber of the heating section 210 to be substantially the same as the temperature condition of the test.

The test section 220 includes a space in which a plurality of devices under test 12 can be tested. The device tray 10 and the tray for adjustment 20 in the heating section 210 are carried in the test section 220. The test section 220 may configure a chamber including an air-tight space in which the temperature, the atmosphere, or the like are controlled. The test section 220 is connected to the test apparatus. The socket board 120 to be mounted to the test head 110 of the test apparatus is positioned in the chamber of the test section 220.

In the test section 220, the device tray 10 is conveyed to the socket board 120, and the plurality of devices under test 12 are electrically connected to the test sockets 122 respectively. Also in the test section 220, the tray for adjustment 20 is conveyed to the socket board 120, and the plurality of socket fitting units 420 fit the test sockets 122 respectively.

The heat removing section 230 includes a space into which the device tray 10 and the tray for adjustment 20 are carried in from the test section 220. The heat removing section 230 discharges the device tray 10 and the tray for adjustment 20 having been carried in, to outside of the heat removing section 230. The heat removing section 230 includes a discharge loader. The discharge loader unloads, to outside of the heat removing section 230, the device tray 10 holding a plurality of devices under test 12 whose temperature has been controlled in the heat removing section 230. The heat removing section 230 may configure a chamber. The heat removing section 230 includes a temperature control section 232.

The temperature control section 232 controls the temperature of the device tray 10 in the heat removing section 230. The temperature control section 232 heats or cools the plurality of devices under test 12 having been carried in from the test section 220, from around the test temperature to the same level as the room temperatures, by controlling the temperature of the device tray 10. The temperature control section 232 may include a thermoelement such as a Peltier element, or may include a cooler or a heater for circulating a cooling medium or a heat medium.

The conveyer 240 conveys the device tray 10 from the heating section 210 to the test section 220. The conveyer 240 makes, fit the test socket 122, the device holder 30 holding the device under test 12, in the test section 220. In addition, the conveyer 240 conveys the device tray 10 from the test section 220 to the heat removing section 230, after the device under test 12 has been tested. The conveyer 240 may receive the device tray 10 carried in from the carry-in loader included in the heating section 210. In addition, the conveyer 240 may transfer the device tray 10 to the discharge loader included in the heat removing section 230. The conveyer 240 includes a device mounting section 242 and a driving section 246.

The device mounting section 242 is provided in the test section 220. The device mounting section 242 mounts the device under test 12 held by the device holder 30, to a corresponding test socket 122 of the socket board 120. The device mounting section 242 includes a plurality of pressing sections 244. The plurality of pressing sections 244 are provided to correspond to the plurality of devices under test 12. The pressing sections 244 mount the devices under test 12 to the test sockets 122 respectively, by pressing the surface of the device holder 30 which is opposite to the surface holding the devices under test 12 towards the socket board 120.

The device mounting section 242 or the pressing sections 244 may include an absorption section for absorbing the device holder 30 on the surface facing the device holder 30. In this case, the device mounting section 242 or the pressing sections 244 remove(s) the device holders 30 mounted to the test sockets 122 by absorbing the devices under test 12 and moving them in a direction apart from the socket board 120.

In addition, the device mounting section 242 may control the temperature of the plurality of devices under test 12 on the device tray 10. In an example, the device mounting section 242 controls the temperature of the plurality of devices under test 12 so as to satisfy the temperature condition of the test executed by the test apparatus. The device mounting section 242 may control the temperature of each of the devices under test 12 in contact with the plurality of pressing sections 244. Here, each of the plurality of pressing sections 244 may control the respective temperatures individually, or alternatively, the pressing sections 244 may control the temperature of two or more pressing sections 244 collectively.

In this case, each of the pressing sections 244 individually heat or cool the surface opposite to the electrode surface or the terminal surface of the corresponding device under test 12. The pressing sections 244 may include a thermoelement such as a Peltier element, or may include a cooler or a heater for circulating a cooling medium or a heat medium. When the pressing sections 244 directly control the temperature of the devices under test 12 respectively, from the backside of the devices under test 12, the handler apparatus 100 can control the temperature of the plurality of devices under test 12 rapidly and at low consumption power, without requiring accurate control of the temperature of the entire chamber of the test section 220. Alternatively, the test section 220 may include a temperature control section for controlling the temperature of the entire chamber of the test section 220 to become substantially the same as the temperature condition of the test.

The driving section 246 drives the device mounting section 242. The driving section 246 controls the movement of the device mounting section 242, conveys the device tray 10 to the socket board 120, and electrically connects the plurality of devices under test 12 to the test sockets 122 respectively.

The test-socket image-capturing section 310 captures an image of a plurality of test sockets 122 included in the socket board 120. The test-socket image-capturing section 310 captures an image of an area including information indicating the position of the electrode in each test socket 122. The test-socket image-capturing section 310 in this example captures an image of a test socket 122 fitting the socket fitting unit 420. The test-socket image-capturing section 310 captures an image of an area including a mark or the like provided for the socket fitting unit 420 and an electrode in a test socket 122. Accordingly, the relative position of the electrode in the test socket 122 with respect to the mark or the like provided for the socket fitting unit 420 is obtained. The test-socket image-capturing section 310 may perform image capturing either on each test socket 122, or on a plurality of test sockets 122. The test-socket image-capturing section 310 may include an image-capturing camera and a moving section for moving the image-capturing camera, and capture the test socket 122 by moving the image-capturing camera to the vicinity of the test socket 122 to be image-captured.

Alternatively, the test-socket image-capturing section 310 may include an image-capturing camera and a mirror, and capture the test socket 122 via the mirror using the image-capturing camera. In this case, the test-socket image-capturing section 310 may capture the image of the test socket 122 to be image-captured, by moving the test socket 122 by means of the moving section for moving the mirror or the like, and by making the image of the test socket 122 to be incident on the image-capturing camera.

On the device tray 10 on which the plurality of devices under test 12 are mounted, the actuator unit 320 adjusts the positions of the devices under test 12 respectively to the positions corresponding to the electrodes of the test sockets 122 to be connected to the devices under test 12. The actuator unit 320 detects the position of the electrode for each device under test 12 in the heating section 210, and adjusts the position of the device under test 12 so as to enable connection of the electrode for the device under test 12 to the electrode for the corresponding test socket 122. In addition, the actuator unit 320 detects and adjusts the original point position, the driving distance, or the like of the actuator that it owns.

The control section 340 is connected to the test-socket image-capturing section 310 and the actuator unit 320, to control the position adjustment of the device under test 12. The control section 340 notifies the actuator unit 320 of the adjustment amount for the device under test 12 based on the image-capturing result of the test-socket image-capturing section 310, the detection result of the actuator unit 320, or the like, to enable adjustment of the position of the device under test 12. In addition, the control section 340 may control loading/unloading/conveyance of the device tray 10 and the tray for adjustment 20, driving of the device mounting section 242, or the like, by being connected to the driving section 246, the conveyer 240, the carry-in loader, the discharge loader, or the like.

In addition, the control section 340 may control the temperature of the plurality of devices under test 12, by being connected to the temperature control section 212, the device mounting section 242, and the temperature control section 232. In addition, the control section 340 may notify the test apparatus of completion of mounting of the plurality of devices under test 12, after mounting the plurality of devices under test 12 to the test sockets 122 respectively. In this case, the test apparatus may test the device under test 12 in response to the notification of mounting completion, and notify the control section 340 of completion or halting of the test. In response to the notification of completion of the test, the control section 340 mounts the device under test 12 on the device tray 10, and discharges the device tray 10.

Figure 9:
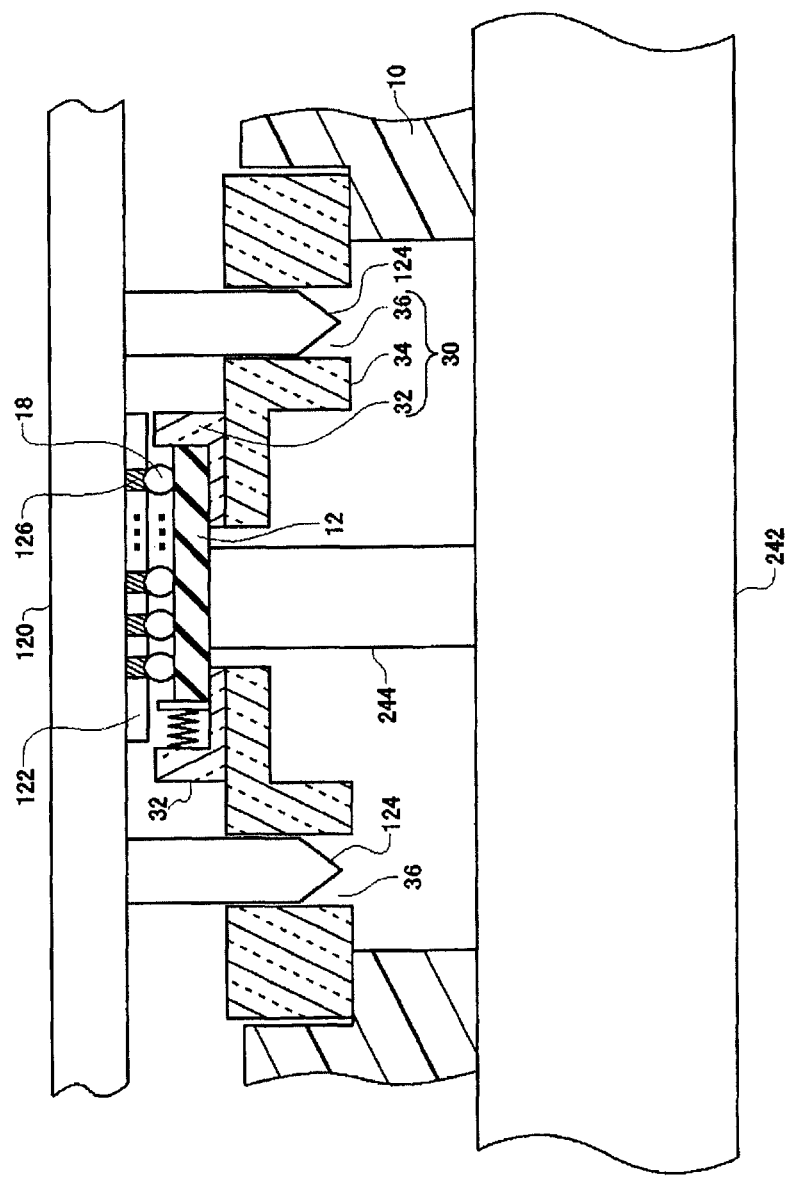
FIG. 9 shows an exemplary configuration in which the handler apparatus 100 according to the present embodiment has conveyed a device under test 12 to a test socket 122.

FIG. 9 shows an exemplary configuration in which the handler apparatus 100 according to the present embodiment has conveyed a device under test 12 to a test socket 122. FIG. 9 shows an example in which the device mounting section 242 has conveyed the device tray 10 mounted thereon to the vicinity of the socket board 120, and the pressing section 244 has mounted the device under test 12 to the corresponding test socket 122 by pressing the device under test 12 towards the socket board 120. In the present embodiment, an example in which the device under test 12 includes a plurality of BGA electrodes 18 is explained.

The test socket 122 is electrically connected to the device under test 12, to convey a test signal supplied from the test apparatus to the device under test 12. In addition, the test socket 122 conveys, to the test apparatus, a response signal outputted by the device under test 12 in accordance with the test signal. The socket board 120 includes a plurality of test sockets 122. The plurality of test sockets 122 may be aligned in both row and column direction on a surface of the socket board 120 opposite to the test head 110. The test socket 122 includes a socket pin 124 and a plurality of electrodes 126. The plurality of electrodes 126 of the test socket 122 are electrically connected to the plurality of electrodes 18 included in the device under test 12.

The socket pin 124 fits the device holder 30. There may be two or more socket pins 124 for a single test socket 122. The socket pins 124 are preferably assigned in the vicinity of four corners of the test socket 122, respectively.

The device holder 30 includes an inner unit 32, an outer unit 34, and a pin insertion section 36. The inner unit 32 mounts each one device under test 12. In an example, the inner unit 32 includes an elastic member for pressing the device under test 12 by elastic force or the like, to fix each device under test 12. The inner unit 32 maintains the fixed and mounted state of the device under test 12, while the device under test 12 is carried in the handler apparatus 100 until it is discharged.

The outer unit 34 holds the inner unit 32 to be movable. The outer unit 34 may include a lock mechanism for mechanically switching whether to set the inner unit 32 to be movable with respect to the outer unit 34, or to be fixed to the outer unit 34. The inner unit 32 and the outer unit 34 include a through hole to pass through the pressing section 244. In this case, the pressing section 244 pass through the inner unit 32 and the outer unit 34, to press the surface of the device under test 12 opposite to the surface on which the electrodes 18 are formed.

Alternatively, the surface of the outer unit 34 opposite to the surface to hold the inner unit 32 may be pressed by the pressing section 244 of the device mounting section 242. In this case, the outer unit 34 may be provided with a concave portion to which the pressing section 244 is pressed. Alternatively, the outer unit 34 may include a through hole to allow the pressing section 244 to pass through, and the pressing section 244 may press the surface of the inner unit 32 opposite to the surface to hold the device under test 12.

The pin insertion section 36 is formed to correspond to the socket pin 124, and fits the socket pin 124. That is, in response to the pressing section 244 pressing the device holder 30 to the test socket 122, the pin insertion section 36 fits the socket pin 124, to electrically connect the electrode 18 of the device under test 12 to the electrode 126 of the test socket 122.

Here, if the manufacturing accuracy or the like of the test apparatus, the handler apparatus 100 or the like becomes substantially the same level as the position accuracy or the like of the device under test 12 due to miniaturization of the size and pitch of the electrode 18 of the device under test 12, there may be cases in which the device under test 12 and the test socket 122 cannot be electrically connected even when the socket pin 124 fits the pin insertion section 36. In view of this, the handler apparatus 100 according to the present embodiment includes the test-socket image-capturing section 310, the actuator unit 320, and so on, and uses the tray for adjustment 20 or the like to adjust, in advance, the position of the device under test 12 to be mounted on the device holder 30, to cause the socket pin 124 to fit the pin insertion section 36, thereby electrically connecting the device under test 12 to the test socket 122.

Figure 10:
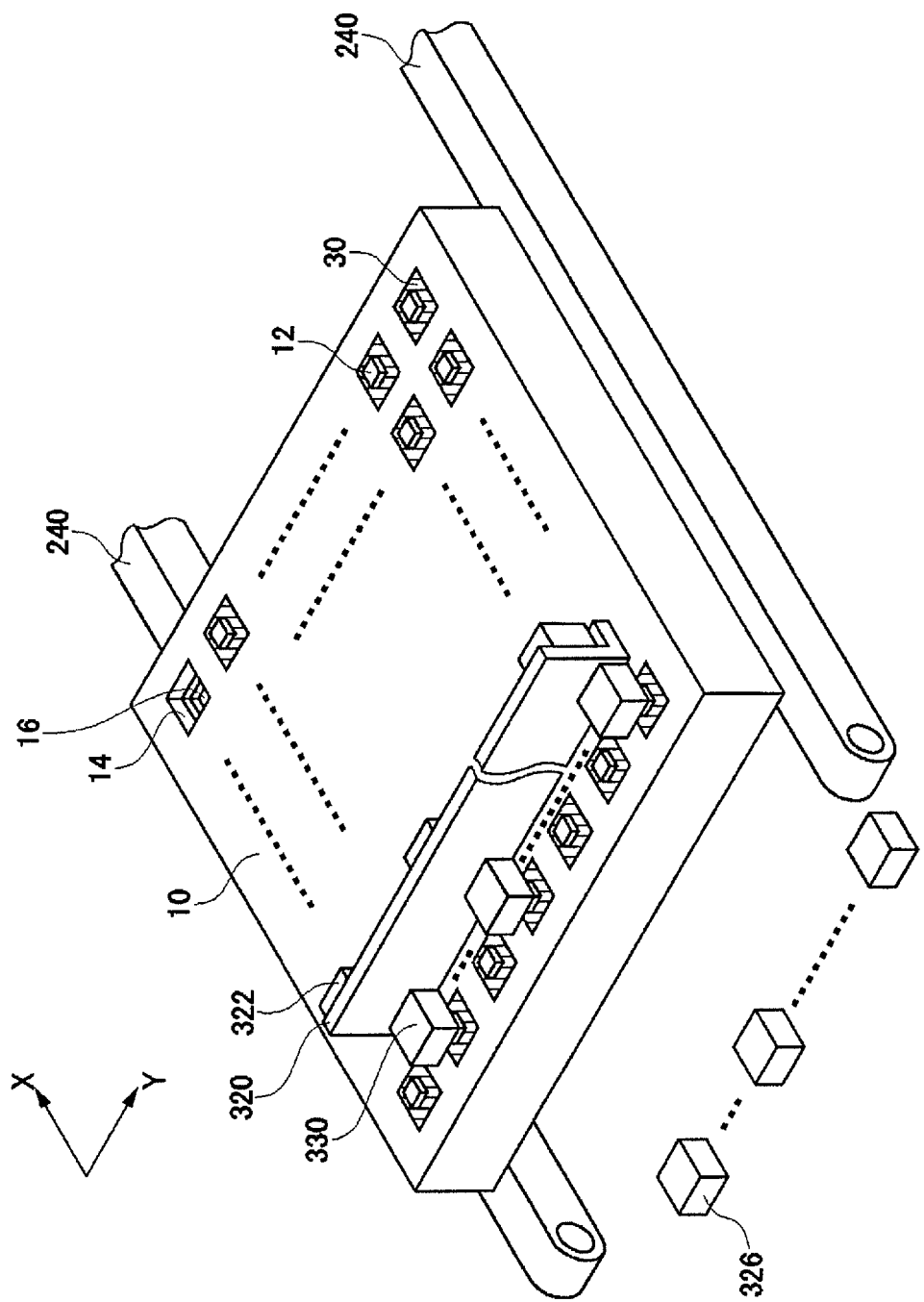
FIG. 10 shows an actuator unit 320 according to the present embodiment, together with a device tray 10.

FIG. 10 shows an actuator unit 320 according to the present embodiment, together with a device tray 10. FIG. 10 shows an example in which the device tray 10 is carried inside the heating section 210 by the carry-in loader, and mounted on the conveyer 240.

In an example, the device tray 10 mounts thereon a plurality of device holders 30 arranged in both row and column directions. The device tray 10 mounts thereon the plurality of device holders 30 to correspond to the arrangement of the test sockets 122 of the test apparatus.

In the present embodiment, an example in which device holders 30 aligned in 16 columns by 16 rows are mounted on the device tray 10 is described. In this case, the device tray 10 holds and conveys 256 devices under test 12 at maximum. Here, the row direction of the device tray 10 is referred to as X axis, and the column direction thereof is referred to as Y axis. In this case, the conveyer 240 moves the device tray 10 in X axis direction, and conveys it among the heating section 210, the test section 220, and the heat removing section 230.

The device tray 10 includes a storage 14 for storing the device holder 30 on one surface of the test section 220 facing the socket board 120. The storage 14 may be a concave formed for each of the plurality of device holders 30. In addition, each storage 14 includes a through hole 16 penetrating the device tray 10 from one surface to the other surface. Accordingly, the pressing section 244 included in the device mounting section 242 may pass through the through hole 16, to press the device holder 30 to the test socket 122.

The actuator unit 320 is provided on the device tray 10. The actuator unit 320 includes an actuator 330. The actuator 330 fits the device holder 30 prior to fitting of the device holder 30 holding the device under test 12 to the test socket 122, to adjust the position of the device under test 12 on the device holder 30. The actuator 330 in this example adjusts the position of the device under test 12 on the device holder 30 by moving the inner unit 32 holding the device under test 12 with respect to the outer unit 34, as described with reference to FIG. 1A through FIG. 7B. The actuator 330 adjusts the position of the device under test 12 on the device holder 30 based on the relative position of the device under test 12 with respect to the socket for adjustment 430 described later.

The actuator unit 320 may include a plurality of actuators 330. In this case, each actuator 330 adjusts the position of the corresponding device under test 12. For example, a plurality of actuators 330 are provided to correspond to the arrangement of the column direction of the devices under test 12, to respectively adjust the plurality of devices under test 12 arranged in the column direction. In this case, 16 actuators 330 may be provided in the column direction (Y direction in this example). The actuator unit 320 may adjust each column of 256 devices under test 12 at maximum, by moving 16 times in X direction by a distance corresponding to the arrangement of one column of the devices under test 12. Alternatively, the conveyer 240 may adjust each column of 256 devices under test 12 at maximum, by moving 16 times the device tray 10 in X direction by a distance corresponding to the arrangement of one column of the devices under test 12.

Alternatively, actuators 330 in number smaller than 16 may be provided in Y direction. In this case, the actuator unit 320 may move in Y direction in the heating section 210, to sequentially adjust the plurality of devices under test 12 aligned in the column direction. In an example, when eight actuators 330 are arranged in the column direction every other row, the eight actuators 330 respectively adjust the eight devices under test 12 in either even or odd lines of the plurality of devices under test 12 aligned in the column direction.

Accordingly, the actuator unit 320 can adjust the total of 16 devices under test 12 aligned in the column direction by moving in Y direction by a distance corresponding to the arrangement of one row of the devices under test 12. In addition, every time the adjustment for one column has finished, the actuator unit 320 moves in X direction by a distance corresponding to the arrangement of one column of the devices under test 12, thereby adjusting 256 devices under test 12 at maximum respectively. Alternatively, the conveyer 240 may adjust 256 devices under test 12 at maximum, by moving the device tray 10 in X direction by a distance corresponding to the arrangement of one column of the devices under test 12, every time the adjustment for one column has finished.

In this way, the actuator unit 320 may move in the column direction, to reduce the number of actuators 330 arranged in the column direction down to 1 at minimum. In the present embodiment, an example in which the actuator unit 320 has eight actuators 330 arranged in the column direction every one row.

Figure 11:
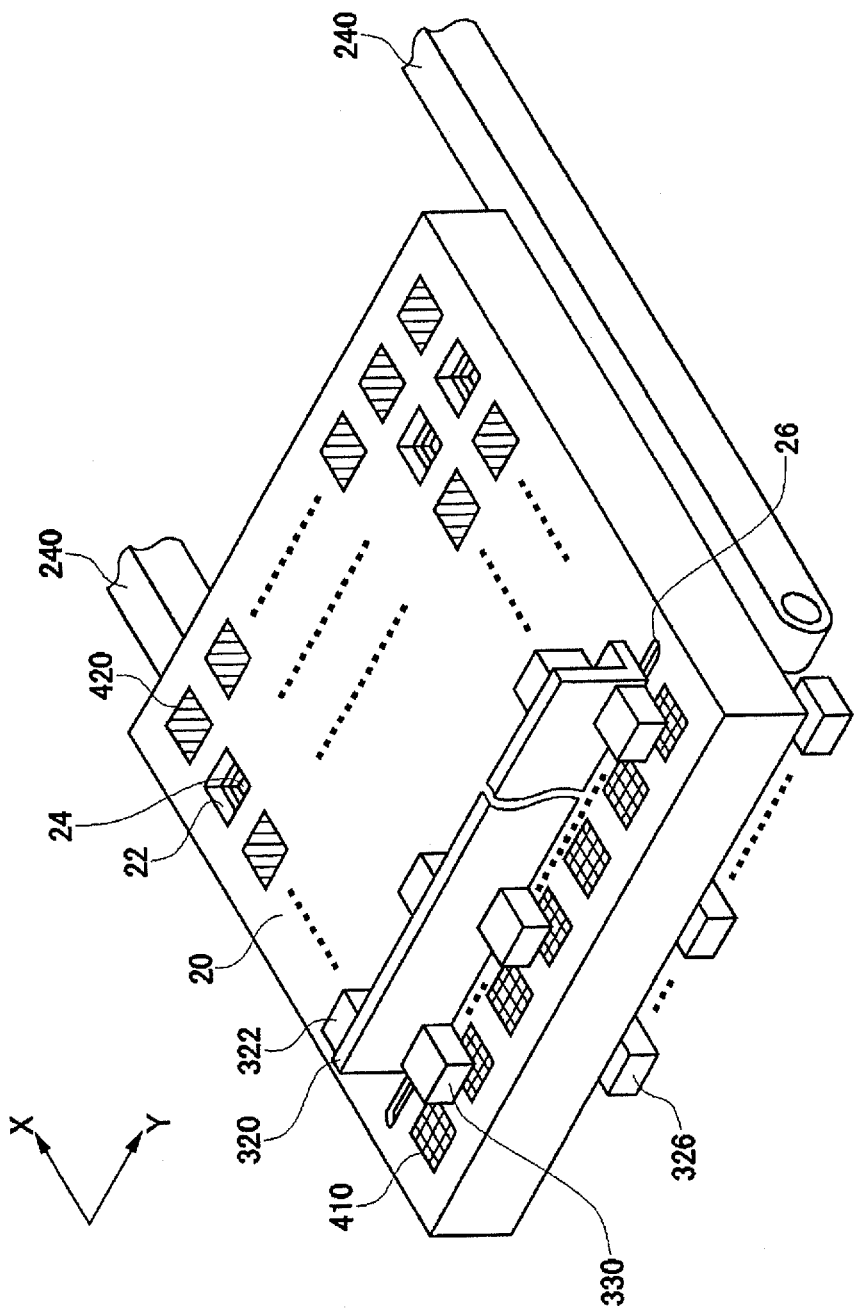
FIG. 11 shows an actuator unit 320 according to the present embodiment, together with a tray for adjustment 20.

FIG. 11 shows an actuator unit 320 according to the present embodiment, together with a tray for adjustment 20. FIG. 11 shows an example in which the tray for adjustment 20 is carried inside the heating section 210 by the carry-in loader, and mounted on the conveyer 240.

The tray for adjustment 20 is formed in substantially the same form as the device tray 10 mounting the device holder 30. The tray for adjustment 20 is formed to have an outer diameter which is the same as the outer diameter of the device tray 10, for example. The tray for adjustment 20 includes a storage 22 and a through slit 26.

For example, the storage 22 is formed in the same arrangement and the same form as the storage 14 of the device tray 10. In addition, each storage 22 includes a through hole 24 penetrating the tray for adjustment 20 from one surface to the other surface.

The tray for adjustment 20 mounts thereon a plurality of actuator fitting units 410 and a plurality of socket fitting units 420. The tray for adjustment 20 stores the actuator fitting units 410 and the socket fitting units 420 respectively in a predetermined arrangement in the storage 22.

For example, the plurality of storages 22 for storing the plurality of actuator fitting units 410 are arranged in the column. FIG. 11 shows an example in which the plurality of storages 22 for storing the plurality of actuator fitting units 410 are arranged in the first column that is opposite to the first side to be carried into the test section 220, in the tray for adjustment 20.

In addition, in an example, the plurality of storages 22 for storing the plurality of socket fitting units 420 are arranged in one column or a plurality of columns. That is, the plurality of socket fitting units 420 are arranged in a predetermined column other than the column of the plurality of storages 22 storing the plurality of actuator fitting units 410.

The through slit 26 penetrates the tray for adjustment 20 from the front surface to the rear surface, and is formed along the plurality of storages 22 for storing the plurality of actuator fitting units 410. FIG. 11 shows an example in which the through slit 26 is formed on the position of the second column adjacent to the aforementioned first column. The position of the through slit 26 in the tray for adjustment 20 corresponds to the position of the second column opposite to the first side to be carried into the test section 220 in the device tray 10. That is, the tray for adjustment 20 may have a form different from the form of the device tray 10, in that it has a through slit 26 instead of the storage 22 in the second column.

The actuator fitting unit 410 fits the actuator 330 included in the actuator unit 320. The actuator fitting unit 410 fits the actuator 330 by the relative position between the actuator unit 320 the tray for adjustment 20 becoming closer. The actuator fitting unit 410 has substantially the same form as at least the portion of the device holder 30 holding the device under test 12.

The socket fitting unit 420 fits the test socket 122. The socket fitting unit 420 fits the test socket 122 as a result of the conveyer 240 conveying the socket fitting unit 420 to the test socket 122 of the test section 220.

Figure 12:
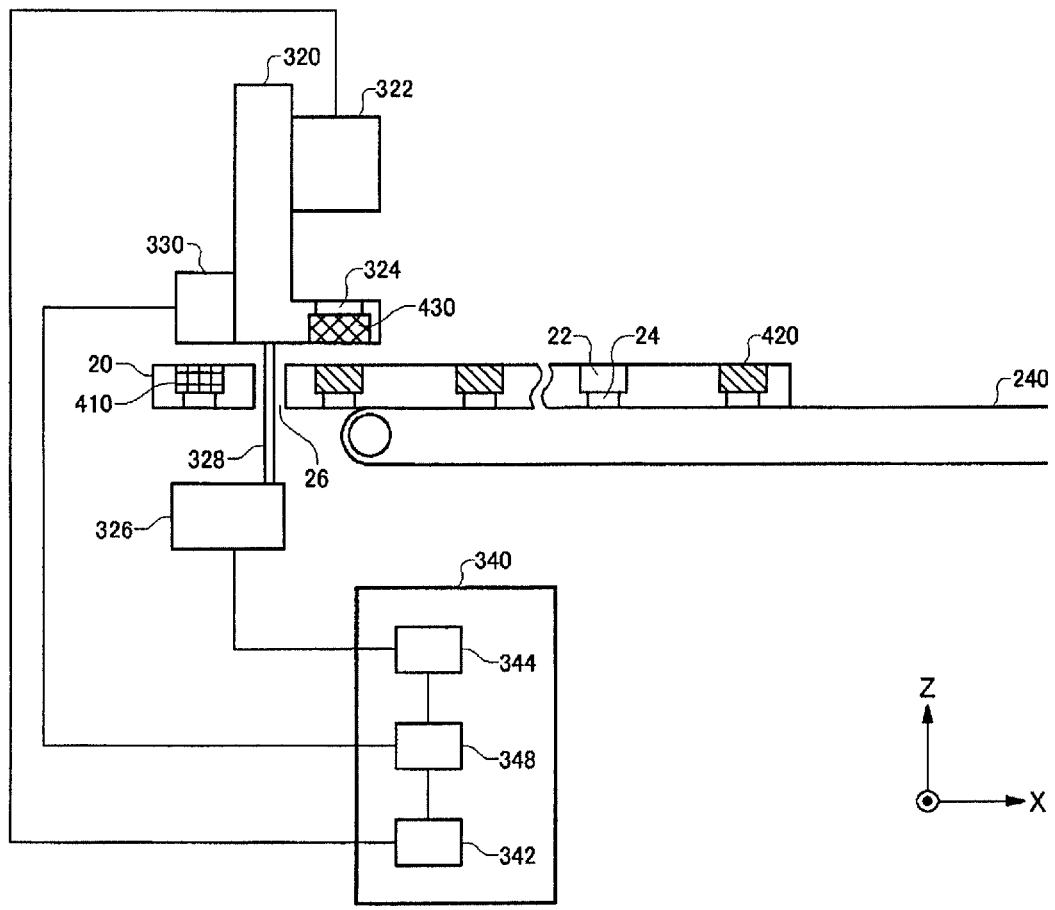
FIG. 12 is a sectional view in X direction of the actuator unit 320 and the tray for adjustment 20 shown in FIG. 11, together with a control section 340.

FIG. 12 is a sectional view in X direction of the actuator unit 320 and the tray for adjustment 20 shown in FIG. 11, together with a control section 340. In addition to the configuration shown in FIG. 11, the actuator unit 320 further includes a socket-for-adjustment image-capturing section 322, a through hole 324, an actuator image-capturing section 326, a link section 328, and a socket for adjustment 430. That is, an example in which the socket-for-adjustment image-capturing section 322, the actuator 330, and the socket for adjustment 430 are integrally formed in the actuator unit 320 is described.

The socket for adjustment 430 sequentially fits the device holder 30, the actuator fitting unit 410, and the socket fitting unit 420. By detecting the relative position of the socket fitting unit 420 and the device under test 12 on the device holder 30 with respect to the socket for adjustment 430 while fitting the socket for adjustment 430, positional difference of the device under test 12 and the socket fitting unit 420 can be detected. In addition, the socket fitting unit 420 can also fit the test socket 122. In addition, while fitting the socket fitting unit 420, the relative position of the test socket 122 with respect to the socket fitting unit 420 is detected. Accordingly, positional difference between the device under test 12 and the test socket 122 can be indirectly detected. Therefore, it becomes possible to detect positional difference of the device under test 12 and the test socket 122, prior to connection of the device under test 12 to the test socket 122, thereby enabling to adjust, in advance, the position of the device under test 12.

In an example, the socket for adjustment 430 is formed on one surface of the actuator unit 320 opposing the device tray 10 and the tray for adjustment 20. In an example, the socket for adjustment 430 fits the device holder 30 by the relative position between the actuator unit 320 and the device tray 10 becoming closer. In addition, the socket for adjustment 430 fits the actuator fitting unit 410 or the socket fitting unit 420 by the relative position between the actuator unit 320 and the tray for adjustment 20 becoming closer.

Here, by conveying the device tray 10 and the tray for adjustment 20 by the conveyer 240 in Z direction, the relative positions between the device tray 10 and the tray for adjustment 20 with respect to the actuator unit 320 may be respectively changed, to make them closer to each other. Instead, by movement of the actuator unit 320 in Z direction, the relative positions between the device tray 10 and the tray for adjustment 20 with respect to the actuator unit 320 may be respectively changed.

The socket-for-adjustment image-capturing section 322 captures an image of the socket for adjustment 430 and the device holder 30 fitting each other, from the side of the device tray 10 at which the device holder 30 is stored. In addition, the socket-for-adjustment image-capturing section 322 captures an image of the socket for adjustment 430 and the actuator fitting unit 410 fitting each other, from the side of the tray for adjustment 20 at which the actuator fitting unit 410 is stored. The socket-for-adjustment image-capturing section 322 may capture an image of a set of a socket for adjustment 430 and a device holder 30 and an image of a set of a socket for adjustment 430 and an actuator fitting unit 410, respectively. Alternatively, the socket-for-adjustment image-capturing section 322 may capture respective images of a plurality of sets of a socket for adjustment 430 and a device holder 30 and the like.

A through hole 324 may penetrate the actuator unit 320 from one surface of the actuator unit 320 facing the device tray 10 and the tray for adjustment 20 to the other surface opposite to the one surface. The through hole 324 is formed on at least a part of the area of the actuator unit 320 on which the socket for adjustment 430 is mounted. The socket-for-adjustment image-capturing section 322 captures, via the through hole 324, an image of the socket for adjustment 430 and the device holder 30 fitting each other and the socket for adjustment 430 and the actuator fitting unit 410 fitting each other, from the other surface of the actuator unit 320.

The actuator image-capturing section 326 captures an image of one actuator 330 or a plurality of actuators 330. The actuator image-capturing section 326 captures an image of the actuator 330 and the actuator fitting unit 410 from the side of the actuator fitting unit 410 opposite to the actuator 330, in the state in which the actuator 330 fits the actuator fitting unit 410. That is, the actuator image-capturing section 326 is provided for a surface of the tray for adjustment 20 opposite to the surface facing the actuator unit 320, and captures an image of the actuator 330 and the actuator fitting unit 410 fit each other, via the through hole 24 of the tray for adjustment 20.

For example, the actuator image-capturing sections 326 are provided along a column corresponding to the actuator 330 in the vicinity of the edge of the conveyer 240 opposite to the test section 220 in the heating section 210. Alternatively, the actuator image-capturing section 326 may be provided along a column at the side opposite to the side of the tray for adjustment 20 in which the actuator units 320 are arranged.

In the present embodiment, eight actuators 330 are arranged in the column direction every other row, and therefore eight actuator image-capturing sections 326 may also be arranged in the column direction every other row corresponding to the actuators 330. When the actuator image-capturing section 326 captures an image of the actuator 330, the conveyer 240 conveys the tray for adjustment 20 to a predetermined position near the edge of the conveyer 240. FIG. 11 and FIG. 5 show an example in which the conveyer 240 conveys the tray for adjustment 20 to the predetermined position.

The link section 328 links the actuator image-capturing section 326 to the actuator unit 320 in which the socket-for-adjustment image-capturing section 322 is provided through the through slit 26. When the actuator image-capturing section 326 captures an image of the actuator 330, the link section 328 links the socket-for-adjustment image-capturing section 322 and the actuator image-capturing section 326.

Accordingly, when the actuator image-capturing section 326 captures the image of a plurality of actuators 330 arranged in the column direction by moving in the column direction, the actuator image-capturing section 326 can move together with the actuator unit 320. Here, when the actuator image-capturing section 326 has a mechanism moving separately and independently from the actuator 330, no link section 328 is required. In addition, while the actuator image-capturing section 326 does not capture an image of the actuator 330, the link section 328 is stored in a position not in contact with any of the conveyer 240 or the tray for adjustment 20.

The control section 340 includes a socket-for-adjustment position detecting section 342, an actuator position detecting section 344, and an actuator adjusting section 348.

While the actuator fitting unit 410 fits the socket for adjustment 430, the socket-for-adjustment position detecting section 342 detects the relative position between the socket for adjustment 430 and the actuator 330. In addition, while the socket for adjustment 430 fits the socket fitting unit 420, the socket-for-adjustment position detecting section 342 detects the relative position between the socket for adjustment 430 and the socket fitting unit 420. In addition, while the socket for adjustment 430 fits the device holder 30, the socket-for-adjustment position detecting section 342 detects the relative position between the socket for adjustment 430 and the reference position of the device holder 30.

The socket-for-adjustment position detecting section 342 is connected to the socket-for-adjustment image-capturing section 322, and based on the image-capturing result of the socket-for-adjustment image-capturing section 322, detects the relative position. The socket-for-adjustment position detecting section 342 supplies the detected relative position to the actuator adjusting section 348.

The actuator position detecting section 344 is connected to the actuator image-capturing section 326, and based on the image-capturing result of the actuator 330 by the actuator image-capturing section 326, detects the distance and direction in which the actuator 330 moves. In addition, the actuator position detecting section 344 detects the relative position between the actuator 330 and the actuator fitting unit 410, based on the image-capturing result of the actuator 330 and the actuator fitting unit 410 fitting each other. The actuator position detecting section 344 supplies the detected relative position to the actuator adjusting section 348.

The actuator adjusting section 348 is connected to the actuator 330, and makes the actuator 330 fit the actuator fitting unit 410, and adjusts the amount of driving of the actuator 330. As described with reference to FIG. 6 to FIG. 7B, the actuator adjusting section 348 adjusts the amount of driving based on the distance and direction in which the actuator 330 has actually moved. When the actuator fitting unit 410 is provided with a mark 530, the actuator adjusting section 348 obtains the operation characteristic of the actuator 330 in advance based on the image captured by moving the actuator 330 the actuator fitting unit 410 fits. When the actuator 330 is provided with a mark 530, the actuator adjusting section 348 obtains the operation characteristic of the actuator 330 in advance, based on the image of the actuator 330 moved, before the actuator fitting unit 410 fits or after the actuator fitting unit 410 is removed.

In addition, the actuator adjusting section 348 adjusts the position of the device under test 12 by driving the actuator 330. The actuator adjusting section 348 calculates the position to which the device under test 12 should be adjusted, and moves the device under test 12 to the position by driving the actuator 330 based on the operation characteristic of the actuator 330. The actuator adjusting section 348 adjusts the position of the device under test 12, based on the detection results supplied by the socket-for-adjustment position detecting section 342 and the actuator position detecting section 344.

Figure 13:
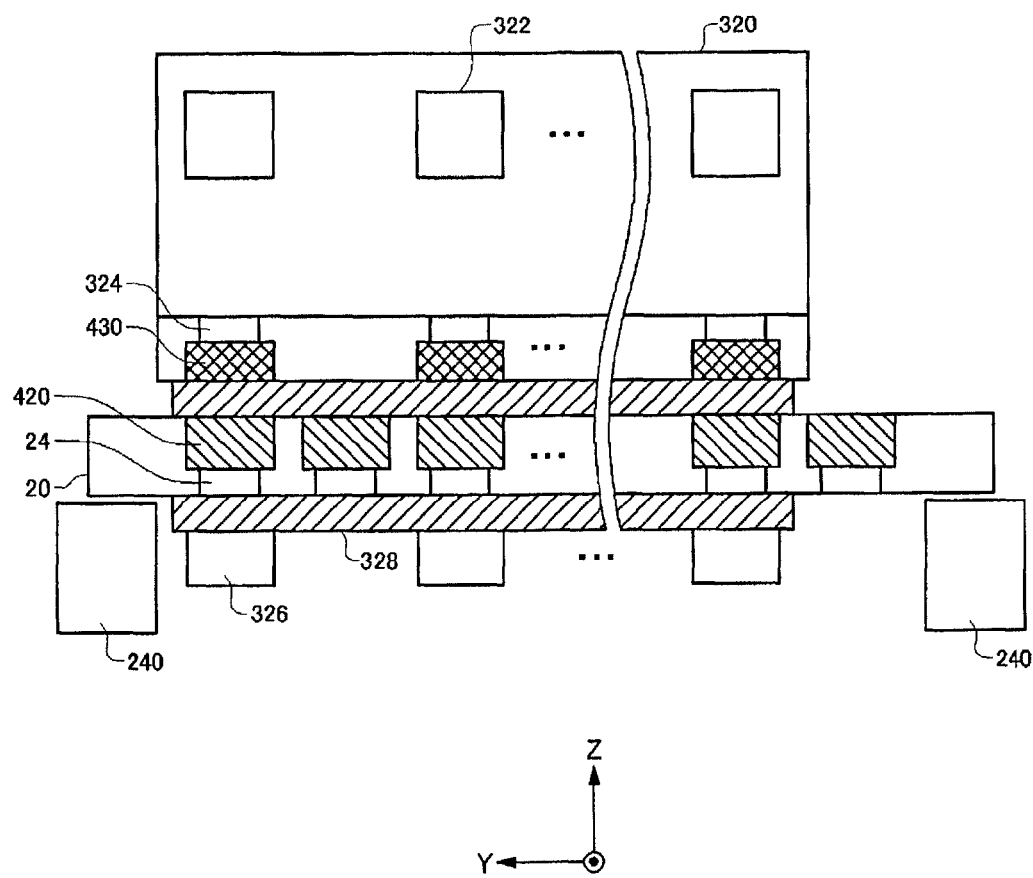
FIG. 13 is a sectional view in Y direction of the actuator unit 320 and the tray for adjustment 20 shown in FIG. 11.

FIG. 13 is a sectional view in Y direction of the actuator unit 320 and the tray for adjustment 20 shown in FIG. 11. The socket-for-adjustment image-capturing section 322 and the socket for adjustment 430 are provided in the actuator unit 320 in correspondence with the socket fitting unit 420. A plurality of socket-for-adjustment image-capturing sections 322 and sockets for adjustment 430 may be provided corresponding in arrangement of the socket fitting units 420 in the column direction. For example, 16 sets of socket-for-adjustment image-capturing sections 322 and sockets for adjustment 430 are provided in the column direction.

Alternatively, in the actuator unit 320, less than 16 sets of socket-for-adjustment image-capturing sections 322 and sockets for adjustment 430 may be provided in the column direction. In this case, the sockets for adjustment 430 move in Y direction in the heating section 210 just as the actuators 330, and the image thereof is captured by respectively fitting the plurality of socket fitting units 420 aligned in the column direction.

FIG. 13 shows an example in which the socket-for-adjustment image-capturing section 322 and the socket for adjustment 430 are provided in correspondence with the socket fitting units 420 aligned every other row in the column direction out of the plurality of socket fitting units 420, just as the actuators 330. In this case, eight sets of socket-for-adjustment image-capturing sections 322 and sockets for adjustment 430 are provided in the column direction every other row, and respectively fit eight socket fitting units 420 in either the odd row or the even row of the plurality of socket fitting units 420 arranged in the column direction.

In the tray for adjustment 20, the actuator fitting units 410 are arranged in the row direction in which the socket fitting units 420, and therefore can fit the sockets for adjustment 430 arranged in the column direction, just as the socket fitting units 420. In addition, the socket-for-adjustment image-capturing section 322 arranged in the column direction can capture an image of the sockets for adjustment 430 and the actuator fitting units 410 fitting each other.

In addition, in the tray for adjustment 20, when the actuator fitting units 410 are stored in the first column and the socket fitting units 420 in the third column, by making the actuator units 320 approach the tray for adjustment 20 to cause the actuators 330 fit the actuator fitting units 410 in the first column, it becomes possible to make the sockets for adjustment 430 fit the socket fitting units 420 in the third column. Accordingly, the actuator image-capturing section 326 can not only capture an image of the actuators 330, but also can the socket-for-adjustment image-capturing section 322 capture the sockets for adjustment 430.

The handler apparatus 100 according to the above-described embodiment, prior to carrying in the device tray 10, carries in the tray for adjustment 20, detects the relative position of each portion in the apparatus, and adjusts the position of the device under test 12 held by the device tray 10. The operation of the handler apparatus 100 will be described with reference to FIG. 14.

Figure 14:
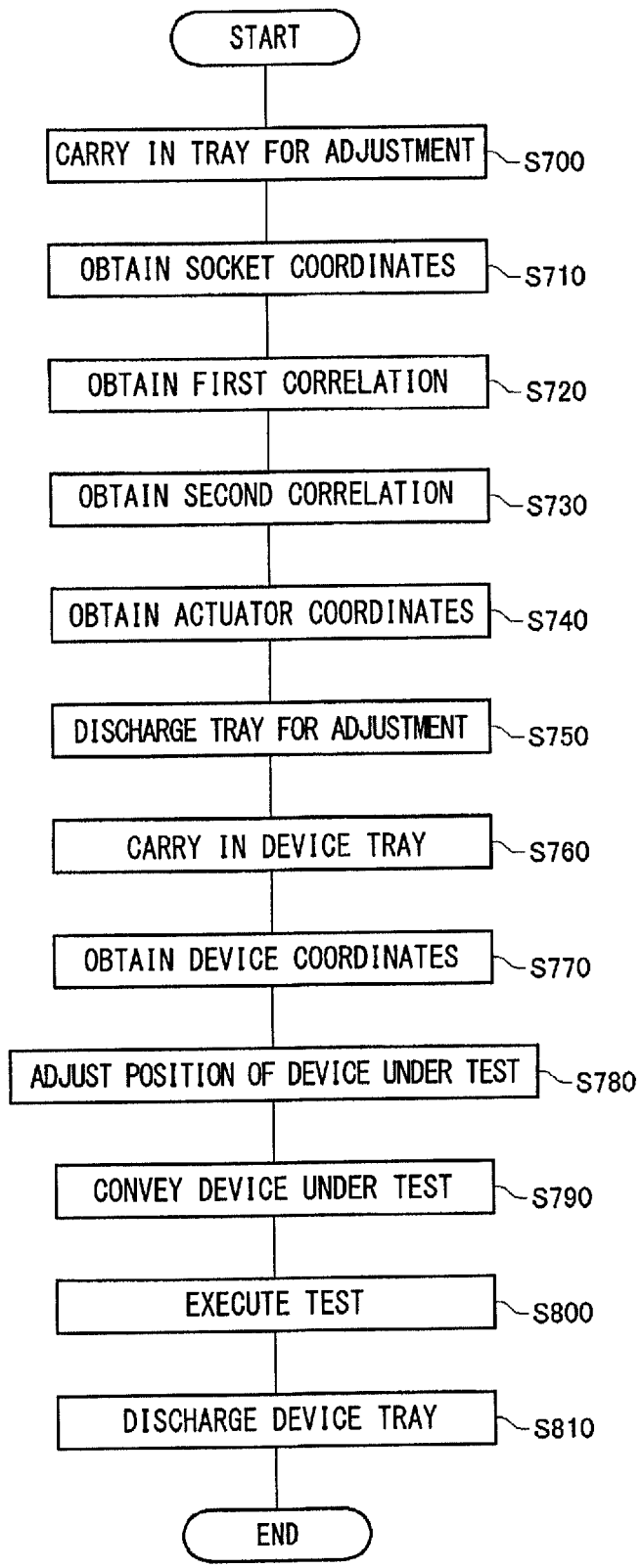
FIG. 14 shows an operational flow of the handler apparatus 100 according to the present embodiment.

FIG. 14 shows an operational flow of the handler apparatus 100 according to the present embodiment. FIG. 15 through FIG. 26 show an exemplary configuration of the handler apparatus 100 during conveyance of the device tray 10 and the tray for adjustment 20 by the handler apparatus 100.

First, the handler apparatus 100 carries in the tray for adjustment 20 (S700). The control section 340 causes the tray for adjustment 20 to be carried in the heating section 210 by the carry-in loader, and uses the conveyer 240 to convey it to the test socket 122 of the test section 220. Then, the control section 340 causes the socket fitting unit 420 stored in the tray for adjustment 20 by the device mounting section 242 to fit the test socket 122. That is, the test socket 122 fits the socket fitting unit 420, prior to the device holder 30 holding the device under test 12 fitting the test socket 122.

Figure 15:
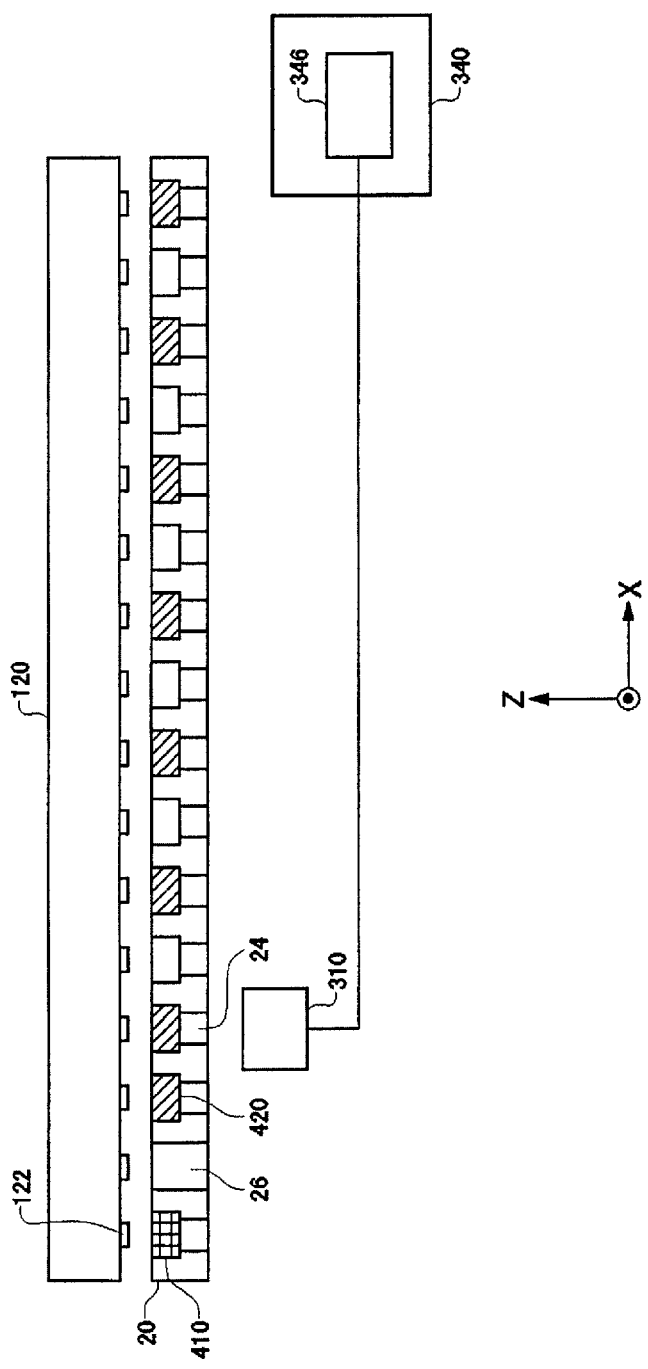
FIG. 15 shows a first exemplary configuration in which a socket fitting unit 420 according to the present embodiment has fitted the test socket 122.

FIG. 15 shows a first exemplary configuration in which a socket fitting unit 420 according to the present embodiment has fitted the test socket 122. In the present embodiment, an example in which the plurality of socket fitting units 420 are stored in the storages 22 in the third, fourth, sixth, eighth, tenth, twelfth, and sixteenth columns from the heating section 210 in the tray for adjustment 20 is explained. Here, the second column in the tray for adjustment 20 in FIG. 15 shows an example in which the through slit 26 is formed.

Next, the test-socket image-capturing section 310 captures an image of the test sockets 122 and socket fitting units 420 in the state in which the socket fitting units 420 fit the test socket 122, and obtains the socket coordinates representing the relative position of the socket fitting units 420 with respect to the test sockets 122 (S710). The test-socket image-capturing section 310 captures the image of the test sockets 122 and socket fitting units 420 fitting them in the third, fourth, sixth, eighth, tenth, twelfth, and sixteenth columns from the heating section 210 on the socket board 120.

Here, the control section 340 further includes a test-socket position detecting section 346 connected to the test-socket image-capturing section 310. The test-socket position detecting section 346 detects the relative position of the socket fitting unit 420 with respect to the test socket 122 in the state in which the test socket 122 fits the socket fitting unit 420.

Figure 16:
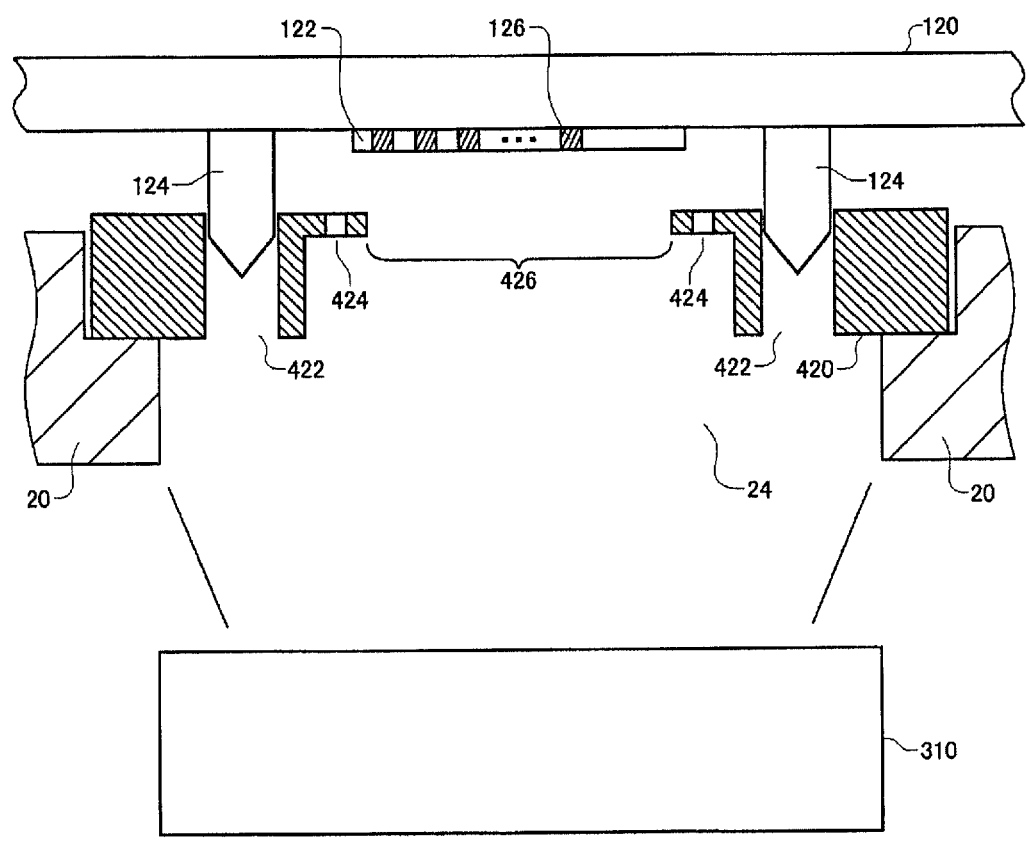
FIG. 16 shows an exemplary configuration in which a test-socket image-capturing section 310 according to the present embodiment captures an image of the test socket 122 and the socket fitting unit 420 fitting each other.

FIG. 16 shows an exemplary configuration in which a test-socket image-capturing section 310 according to the present embodiment captures an image of the test socket 122 and the socket fitting unit 420 fitting each other. Here, the socket fitting unit 420 includes a pin insertion section 422, a reference mark 424, and an opening 426. The pin insertion section 422 fits the socket pin 124. That is, the socket fitting unit 420 has a form that is the same as the form of at least the portion of the device holder 30 fitting the socket pin 124.

The reference mark 424 may be a convex, a concave, a material different in color or reflection rate, a through hole, or the like. FIG. 16 shows an example in which a through hole is formed. The opening 426 is a through hole that facilitates observation of an area including at least a part of the electrode 126 of the test socket 122 in the state in which it fits the test socket 122, from the side opposite to the surface that the test socket 122 fits.

The test-socket image-capturing section 310 captures an image of an area including at least a part of the reference mark of the socket fitting unit 420 and the test socket 122, in the state in which the socket fitting unit 420 fits the test socket 122, from the side of the socket fitting unit 420. The area whose image is captured by the test-socket image-capturing section 310 includes information indicating the position of the electrode 126 of the test socket 122. In this example, the information indicating the position of the electrode 126 is very the electrode 126 exposed in the opening 426 itself. In a different example, the information indicating the position of the electrode 126 may be a reference mark or the like provided on the test socket 122. The opening 426 may not be an area surrounded by the socket fitting unit 420. The test-socket position detecting section 346 detects the relative position between the electrode 126 of the test socket 122 and the reference mark of the socket fitting unit 420, based on the image-capturing result of the test-socket image-capturing section 310. That is, the test-socket position detecting section 346 detects the relative position of the electrode 126 of the test socket 122 with respect to the reference mark 424 of the socket fitting unit 420. By adjusting the position of the device under test 12 to correspond to the relative position of the electrode 126 of the test socket 122, it becomes possible to connect the test socket 122 with the device under test 12 with accuracy.

Next, the conveyer 240 conveys the tray for adjustment 20 so as to sequentially makes the socket fitting unit 420 fit two or more test sockets 122. For example, the conveyer 240 conveys the tray for adjustment 20 the distance worth of one column of the test sockets 122, towards the heating section 210 in the row direction (X direction). By doing so, the socket fitting units 420 stored in the storages 22 in the third, fourth, sixth, eighth, tenth, twelfth, and sixteenth columns can fit the test sockets 122 in the second, third, fifth, seventh, ninth, eleventh, thirteenth, and fifteenth columns from the heating section 210 of the socket board 120.

The test-socket image-capturing section 310 captures an image of the test socket 122 and the socket fitting unit 420 fitting each other from the side of the socket fitting unit 420. For this reason, the reference mark 424 is provided to be observable from the surface opposite to the surface that the test socket 122 fits, in the socket fitting unit 420.

The socket fitting unit 420 also fits the socket for adjustment 430. As detailed later, the image of the socket fitting unit 420 and the socket for adjustment 430 fitting each other will be captured from the side of the socket for adjustment 430. For this reason, the reference mark 424 of the socket fitting unit 420 is provided to be observable also from the surface fitting the socket for adjustment 430. That is, the reference mark 424 is a mark observable from both of the surface fitting the test socket 122 and the socket for adjustment 430 and the surface opposite to the surface fitting the test socket 122 and the socket for adjustment 430. In addition, the reference mark 424 of the socket fitting unit 420 is provided at a position not covered with the socket for adjustment 430 in the state in which the socket fitting unit 420 fits the socket for adjustment 430.

Figure 17:
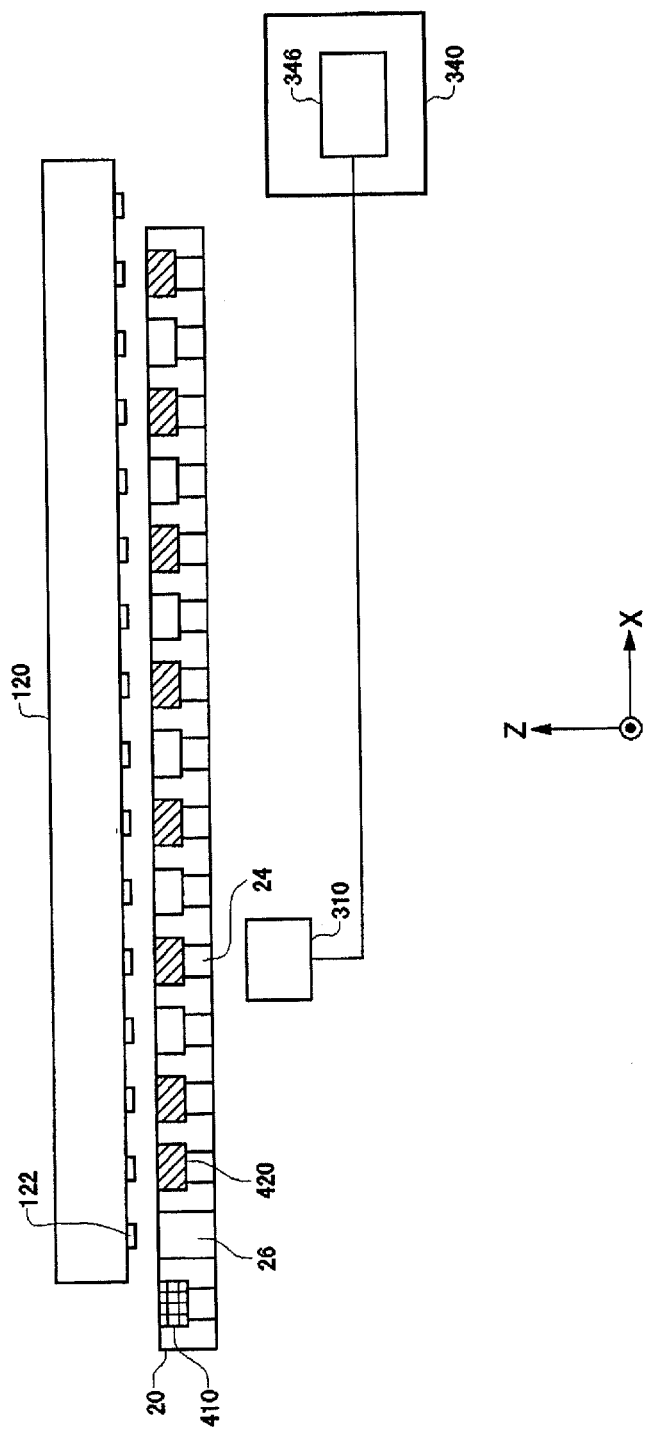
FIG. 17 shows a second exemplary configuration in which the socket fitting unit 420 according to the present embodiment has fitted the test socket 122.

FIG. 17 shows a second exemplary configuration in which the socket fitting unit 420 according to the present embodiment has fitted the test socket 122. In the state shown in FIG. 17, the test-socket image-capturing section 310 captures an image of the test sockets 122 in the second, fifth, seventh, ninth, eleventh, thirteenth, and fifteenth columns of the socket board 120 as well as the fitting socket fitting units 420. In the socket board 120, the first column, the second column, . . . the sixteenth column are numbered starting from the end column in the negative direction on X axis. In addition, the test-socket position detecting section 346 detects the relative position between the electrode 126 of the test socket 122 in each targeted column and the reference mark on the socket fitting unit 420, respectively, based on the image-capturing result of the test-socket image-capturing section 310.

Likewise, the conveyer 240 conveys the tray for adjustment 20 one column towards the heating section 210 in the row direction. By doing so, the socket fitting unit 420 can fit the test sockets 122 in the first, second fourth, sixth, eighth, tenth, twelfth, and fourteenth columns of the socket board 120.

Figure 18:
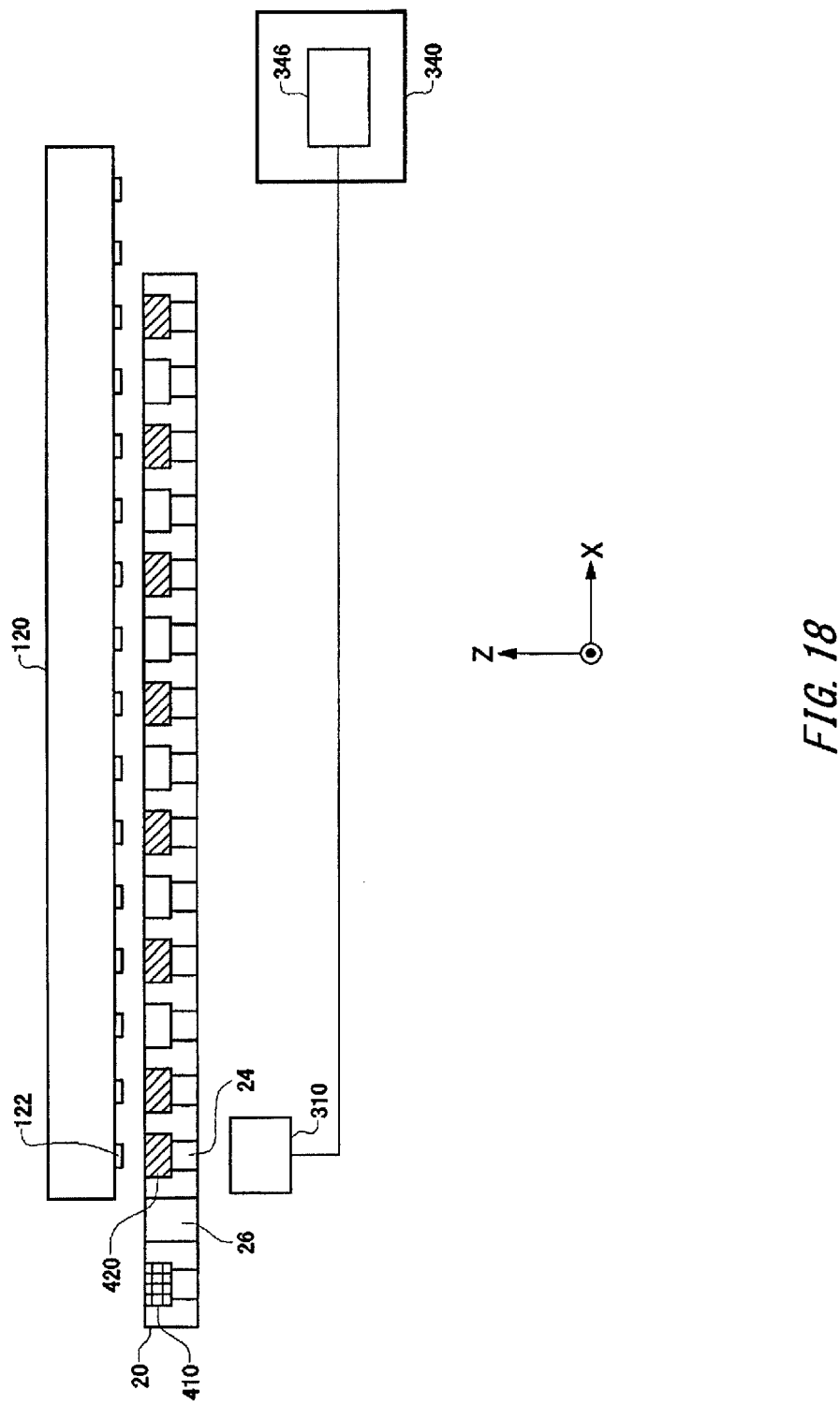
FIG. 18 shows a third exemplary configuration in which the socket fitting unit 420 according to the present embodiment has fitted the test socket 122.

FIG. 18 shows a third exemplary configuration in which the socket fitting unit 420 according to the present embodiment has fitted the test socket 122. Accordingly, the test-socket image-capturing section 310 captures an image of the test socket 122 in the first column of the socket board 120 as well as the fitting socket fitting unit 420. In addition, based on the image-capturing result of the test-socket image-capturing section 310, the test-socket position detecting section 346 detects the relative position between the electrodes 126 of the test sockets 122 and the reference marks of the socket fitting units 420 respectively, to obtain the socket coordinates of all the test sockets 122.

Next, the handler apparatus 100 makes the socket fitting unit 420 fit the socket for adjustment 430, to obtain the first correlation between the socket for adjustment 430 and the test socket 122 (S720). For example, when fitting the socket fitting unit 420, the first correlation includes information indicating the positional difference between the relative position of the socket for adjustment 430 with respect to the socket fitting unit 420 and the relative position of the test socket 122 with respect to the socket fitting unit 420. In this way, the socket fitting unit 420 is sequentially caused to fit the test socket 122 and the socket for adjustment 430. In addition, the conveyer 240 conveys the tray for adjustment 20, so as to sequentially cause the socket for adjustment 430 fit two or more socket fitting units 420. The conveyer 240 may convey the tray for adjustment 20 so that all the socket fitting units 420 stored in the tray for adjustment 20 fit the socket for adjustment 430.

Figure 19:
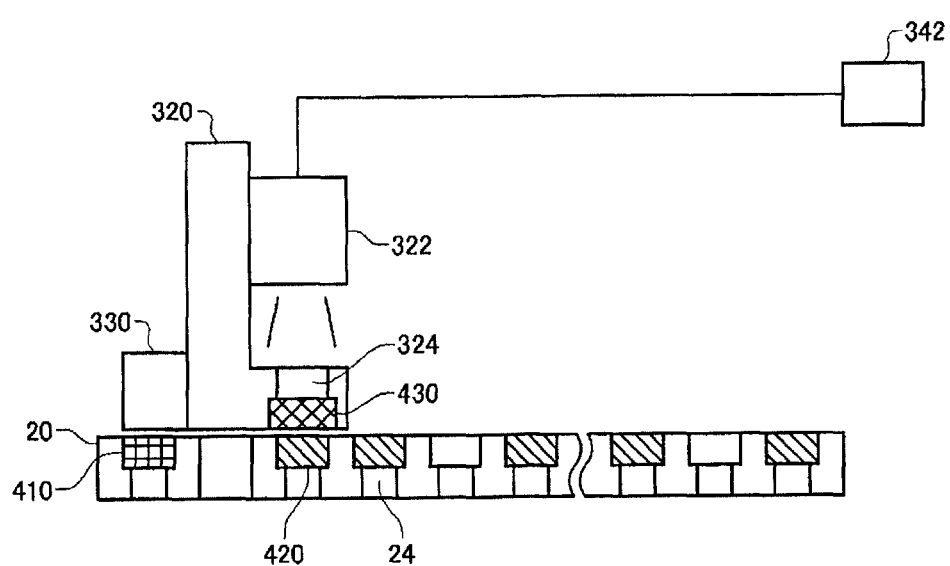
FIG. 19 shows an exemplary configuration in which the socket fitting unit 420 according to the present embodiment has fitted a socket for adjustment 430.

FIG. 19 shows an exemplary configuration in which the socket fitting unit 420 according to the present embodiment has fitted the socket for adjustment 430. FIG. 19 shows an example in which the socket fitting unit 420 in the third column in the tray for adjustment 20 has fitted the socket for adjustment 430. The control section 340 may control to sequentially move the conveyer 240 and/or the actuator unit 320 so that the socket fitting unit 420 in the other column in the tray for adjustment 20 fits the socket for adjustment 430.

Figure 20:
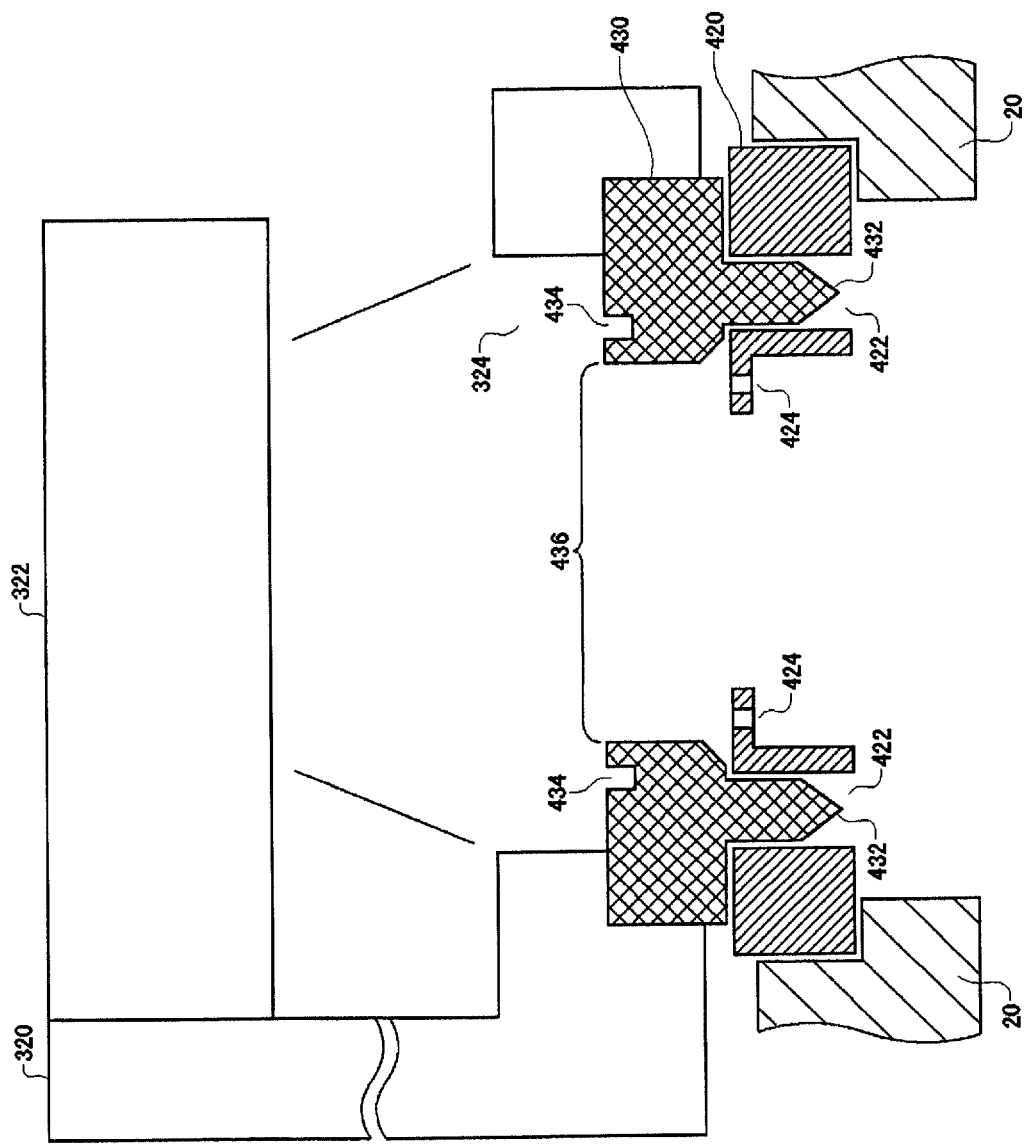
FIG. 20 shows an exemplary configuration in which a socket-for-adjustment image-capturing section 322 according to the present embodiment captures an image of the socket for adjustment 430 and the socket fitting unit 420 fitting each other.

The socket-for-adjustment image-capturing section 322 captures an image of the socket for adjustment 430 and the socket fitting unit 420, in the state in which the socket fitting unit 420 has fitted the socket for adjustment 430. FIG. 20 shows an exemplary configuration in which a socket-for-adjustment image-capturing section 322 according to the present embodiment captures an image of the socket for adjustment 430 and the socket fitting unit 420 fitting each other.

Here, the socket for adjustment 430 includes a socket pin 432, a reference mark 434, and an opening 436. The socket pin 432 fits the pin insertion section 422. That is, the socket for adjustment 430 has a form that is the same as the form of a portion of the test socket 122 at least fitting the device holder 30.

The reference mark 434 is a mark observable from the surface of the socket for adjustment 430, which is opposite to the surface that the device holder 30 and the socket fitting unit 420 fit. The reference mark 434 may be a convex, a concave, a material different in color or reflection rate, a through hole, or the like. FIG. 20 shows an example in which a convex is formed. The opening 436 is a through hole from which a part of the area of the socket fitting unit 420 is observable from the side opposite to the surface fitting the socket fitting unit 420. In this example, the part of the area includes a reference mark 424. In addition, the socket for adjustment 430 also fits the device holder 30. Through the opening 436, at least a part of the electrodes 18 of the device under test 12 is observable from the opposite surface, in the state fitted to the device holder 30.

The socket-for-adjustment image-capturing section 322 captures an image of the area including at least a part of the reference mark 424 of the socket fitting unit 420 and the socket for adjustment 430, via the through hole 324 and the opening 436, from the side of the socket for adjustment 430, in the state in which the socket fitting unit 420 has fitted the socket for adjustment 430. Here, the socket-for-adjustment image-capturing section 322 may capture an image including the reference mark 434 of the socket for adjustment 430.

The socket-for-adjustment position detecting section 342 detects the relative position of the socket fitting unit 420 with respect to the socket for adjustment 430 in the state in which the socket for adjustment 430 has fitted the socket fitting unit 420, based on the image-capturing result of the socket-for-adjustment image-capturing section 322. In an example, the socket-for-adjustment position detecting section 342 detects, as the relative position, the distance and direction between the reference marks 424 of the socket fitting units 420 and the reference marks 434 of the sockets for adjustment 430, respectively.

The control section 340 obtains the first correlation between the socket for adjustment 430 and the test socket 122, based on the detected relative position of the socket for adjustment 430 with respect to the socket fitting unit 420 and the relative position of the test socket 122 with respect to the socket fitting unit 420. For example, the socket-for-adjustment position detecting section 342 supplies the detected relative position to the test-socket position detecting section 346. The test-socket position detecting section 346 detects the positional difference between the relative position between the test socket 122 and the socket fitting unit 420 and the relative position between the socket fitting unit 420 and the socket for adjustment 430, as the amount of positional difference between the test socket 122 and the socket for adjustment 430, and sets it as the first correlation. The test-socket position detecting section 346 may supply the detected first correlation to the socket-for-adjustment position detecting section 342.

Next, the handler apparatus 100 makes the actuator fitting unit 410 fit the socket for adjustment 430, and obtains a second correlation between the test socket 122 and the actuator fitting unit 410 (S730). Here, the handler apparatus 100 obtains the first correlation between the socket for adjustment 430 and the test socket 122, and therefore, by detecting the relative position between the socket for adjustment 430 and the actuator fitting unit 410, the handler apparatus 100 can obtain the correlation between the actuator fitting unit 410 and the test socket 122.

Figure 21:
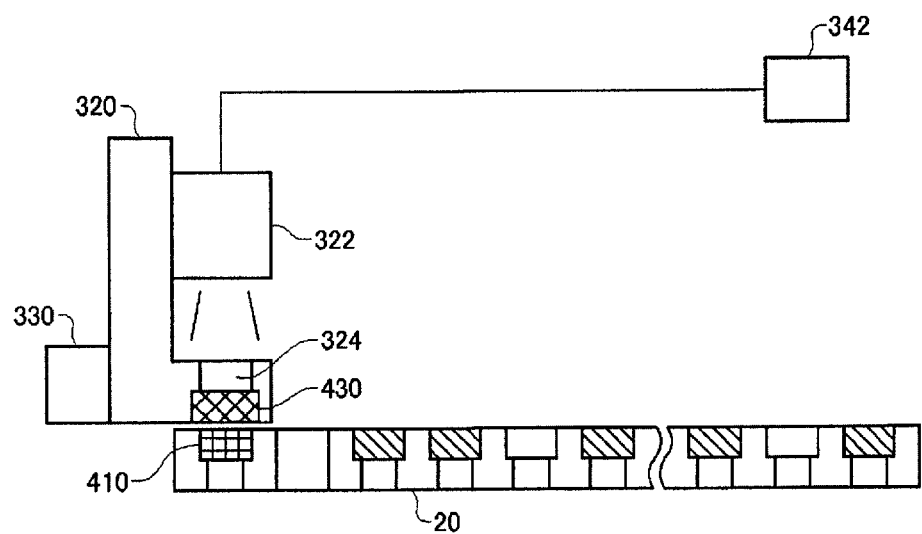
FIG. 21 shows an exemplary configuration in which the socket for adjustment 430 according to the present embodiment has fitted the actuator fitting unit 410.
Figure 22:
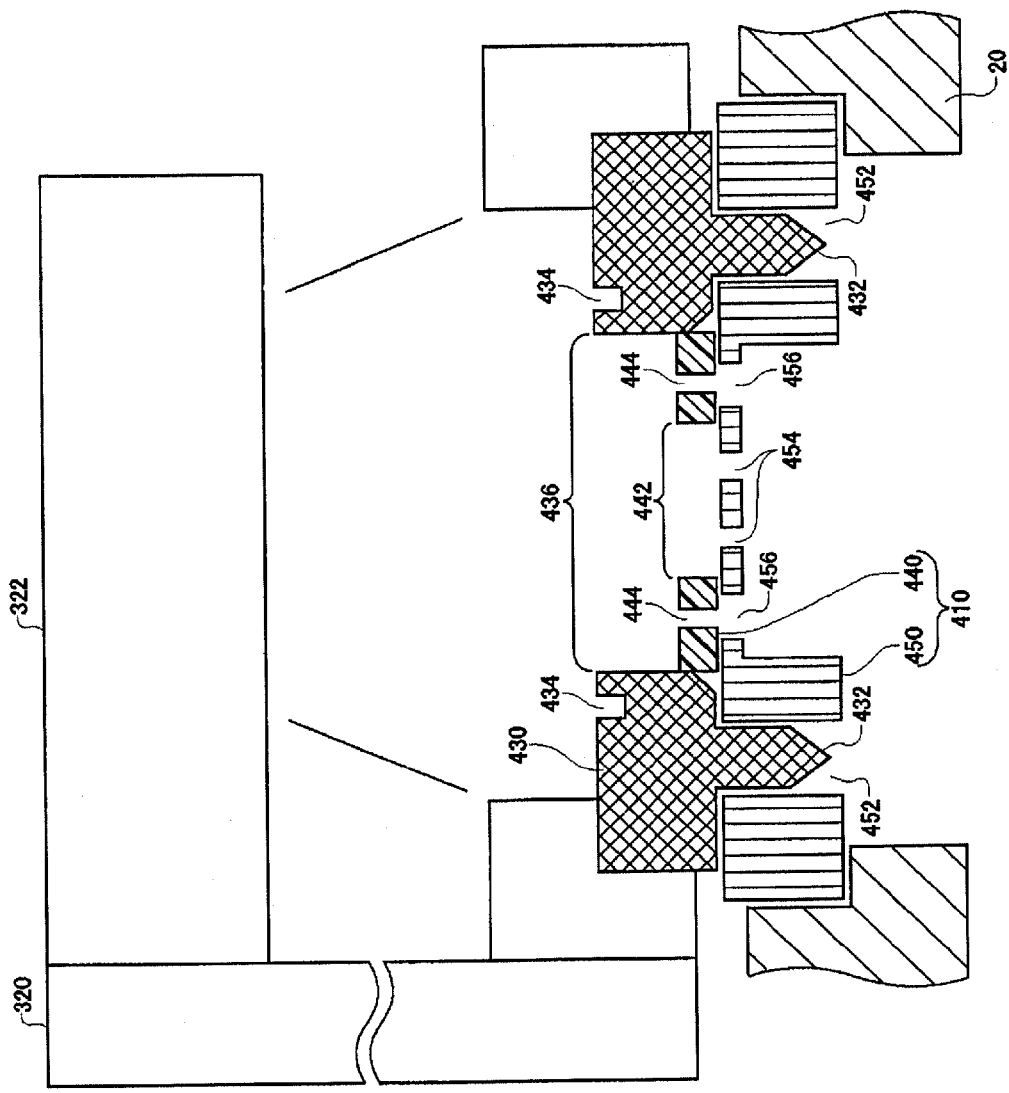
FIG. 22 shows an exemplary configuration in which a socket-for-adjustment image-capturing section 322 according to the present embodiment captures an image of the socket for adjustment 430 and the actuator fitting unit 410 fitting each other.

FIG. 21 shows an exemplary configuration in which the socket for adjustment 430 according to the present embodiment has fitting the actuator fitting unit 410. The socket-for-adjustment image-capturing section 322 captures an image of the socket for adjustment 430 and the actuator fitting unit 410 from the side of the socket for adjustment 430, in the state in which the socket for adjustment 430 has fitted the actuator fitting unit 410. Here, the socket-for-adjustment image-capturing section 322 may sequentially capture an image of the plurality of the actuator fitting units 410 fitted the socket for adjustment 430 from the front surface of the tray for adjustment 20. FIG. 22 shows an exemplary configuration in which a socket-for-adjustment image-capturing section 322 according to the present embodiment captures an image of the socket for adjustment 430 and the actuator fitting unit 410 fitting each other.

Here, the actuator fitting unit 410 includes an inner unit 440 and an outer unit 450. The inner unit 440 is formed to have an outer shape that is substantially the same as the outer shape of the inner unit 32 of the device holder 30. That is, by obtaining the second correlation, the inner unit 440 matches in shape the inner unit 32 of the device holder 30, to the extent that the correlation between the inner unit 32 of the device holder 30 and the test socket 122 can be obtained.

The inner unit 440 includes an opening 442 and a reference mark 444. The opening 442 is a through hole through which at least a part of the area of the outer unit 450 holding the inner unit 440 is observable from the surface opposite to the surface holding the inner unit 440. The reference mark 444 is a mark observable at both of the surface fitting the socket for adjustment 430 and the opposite surface thereto. The reference mark 424 a convex, a concave, a material different in color or reflection rate, a through hole, or the like. FIG. 22 shows an example in which a through hole is formed.

The outer unit 450 holds the inner unit 440 to be movable. The outer unit 450 may include a lock mechanism for mechanically switching whether to hold the inner unit 440 to be movable. The outer unit 450 includes a pin insertion section 452, a reference mark 454, and an opening 456. The pin insertion section 452 fits the socket pin 432. That is, the outer unit 450 has a shape that is the same as the shape of the portion of the device holder 30 at least fitting the socket pin 124.

The reference mark 454 is a mark observable from both of the surface fitting the socket for adjustment 430 and the actuator 330 and the opposite surface thereto. The reference mark 454 may be a convex, a concave, a material different in color or reflection rate, a through hole, or the like. FIG. 22 shows an example in which a through hole is formed. The reference mark 454 is formed in a position of one surface holding the inner unit 440, which is observable through the opening 442 of the inner unit 440 from the one surface. The opening 456 is a through hole through which at least the area of the inner unit 440 on which the reference mark 424 is formed can be observed from the side opposite to the surface fitting the socket for adjustment 430.

Here, the socket for adjustment 430 fits the outer unit 450, to fix the position of the outer unit 450, as well as fixing the position of the inner unit 440 by the inner wall of the opening 436. When the outer unit 450 includes a lock mechanism for holding the inner unit 440, the socket for adjustment 430 fits the outer unit 450 as well as unlocking the lock mechanism to set the inner unit 440 to be movable, and fixes the position of the inner unit 440 by the inner wall of the opening 436.

The socket-for-adjustment image-capturing section 322 captures an image of the socket for adjustment 430 and the actuator fitting unit 410 fitted each other, from the side of the front surface of the tray for adjustment 20 through the through hole 324. The socket-for-adjustment position detecting section 342 detects the relative position between the socket for adjustment 430 and the actuator fitting unit 410, based on the image-capturing result of the socket-for-adjustment image-capturing section 322.

Since the socket for adjustment 430 fixes the position of the inner unit 440 and the outer unit 450, the socket-for-adjustment position detecting section 342 can detect not only the relative position between the socket for adjustment 430 and the outer unit 450 but also the relative position with respect to the inner unit 440. That is, the socket-for-adjustment position detecting section 342 detects the position of the reference mark 454 of the outer unit 450 and the position of the reference mark 444 of the inner unit 440 respectively, to detect the relative position between the reference mark 454 and the reference mark 444.

In addition, the socket-for-adjustment position detecting section 342 has obtained the first correlation with respect to the test socket 122, and therefore can also determine the position of the reference mark 454 in the test socket 122, by detecting the position of the reference mark 454 of the outer unit 450. In this case, the socket-for-adjustment position detecting section 342 may determine the position of the reference mark 454 in the test socket 122, according to the relative position from the reference mark 434 of the socket for adjustment 430 to the reference mark 454 of the outer unit 450.

Figure 23:
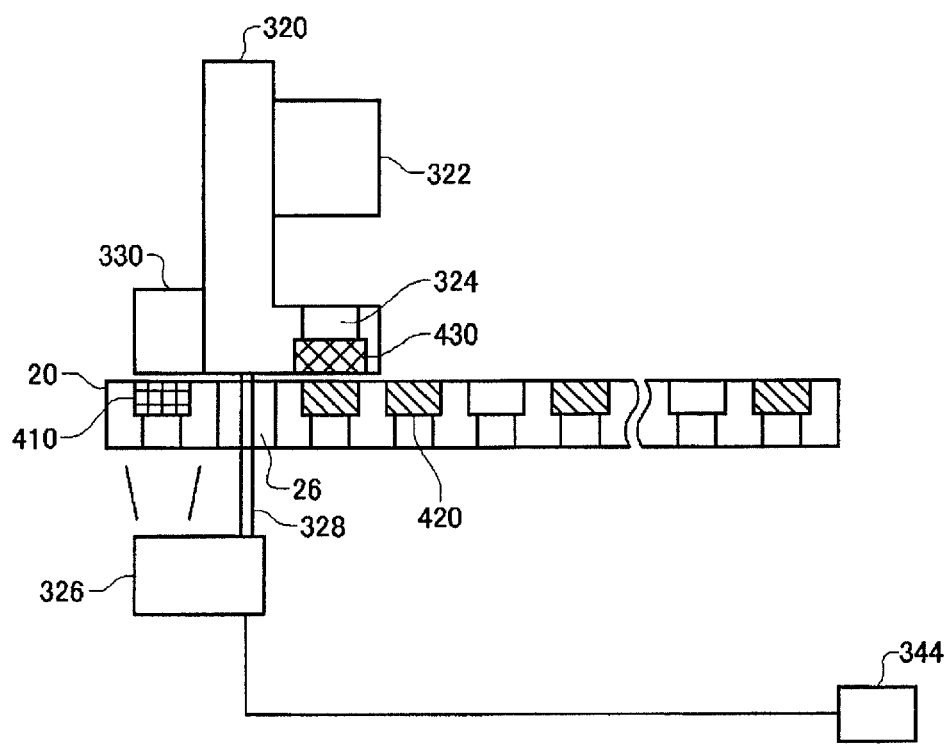
FIG. 23 shows an exemplary configuration in which the actuator fitting unit 410 according to the present embodiment has fitted the actuator 330.

Next, the handler apparatus 100 makes the actuator 330 fit the actuator fitting unit 410, to obtain the actuator coordinates being the initial position of the actuator 330 (S740). FIG. 23 shows an exemplary configuration in which the actuator fitting unit 410 according to the present embodiment has fitted the actuator 330.

The actuator image-capturing section 326 captures an image of the actuator 330 and the actuator fitting unit 410 from the side of the actuator fitting unit 410, in the state in which the actuator 330 fits the actuator fitting unit 410. Here, the actuator image-capturing section 326 may sequentially capture an image of the plurality of actuator fitting units 410 fitting the actuators 330, from the rear side of the tray for adjustment 20. The actuator adjusting section 348 adjusts the amount of driving of the actuator 330 based on the image-capturing result of the actuator image-capturing section 326 and the socket-for-adjustment image-capturing section 322.

Figure 24:
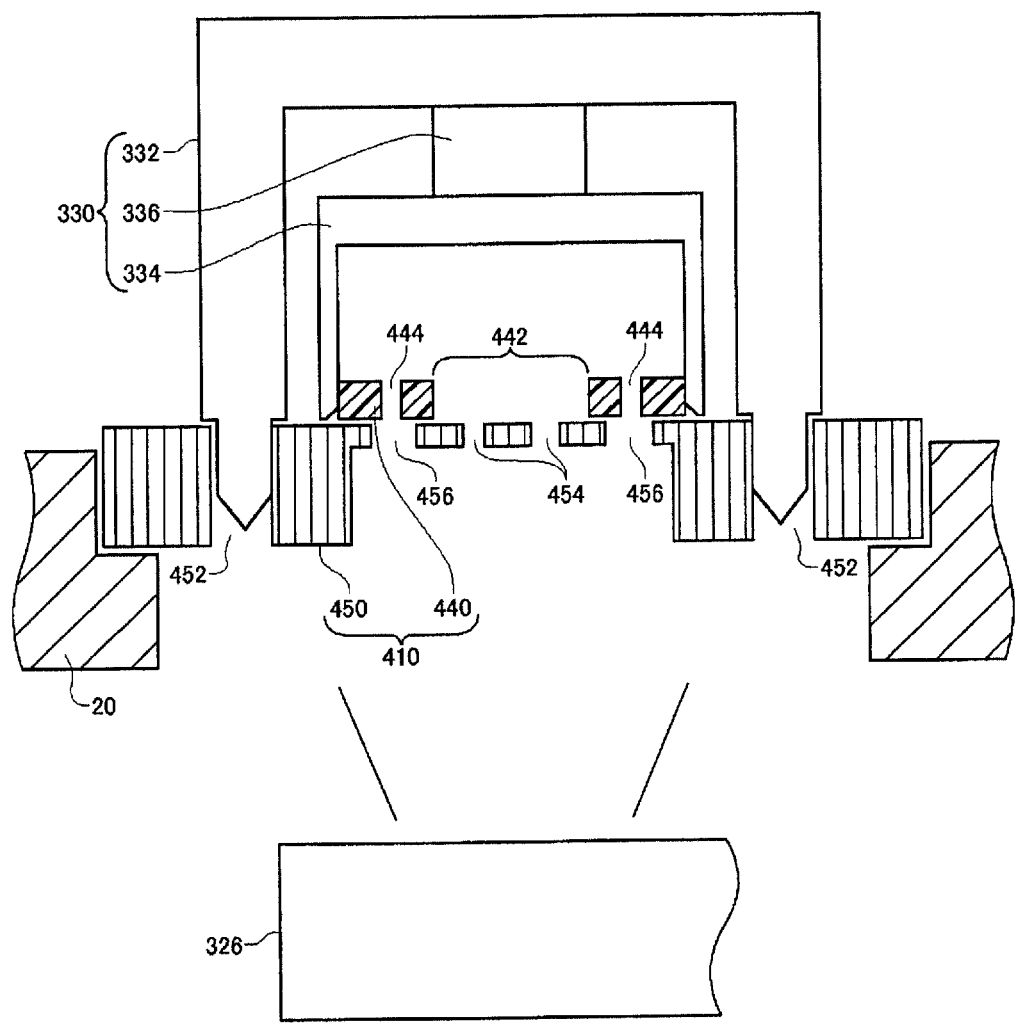
FIG. 24 shows an exemplary configuration in which an actuator image-capturing section 326 according to the present embodiment captures an image of the actuator fitting unit 410 and the actuator 330 fitting each other.

FIG. 24 shows an exemplary configuration in which an actuator image-capturing section 326 captures an image of the actuator fitting unit 410 and the actuator 330 fitting each other. Here, the actuator 330 includes an outer catch section 332, an inner catch section 334, and an actuator driving section 336.

The outer catch section 332 grasps the outer unit 450 of the actuator fitting unit 410. The outer catch section 332 has a shape that is the same as the shape of the socket pin 124, and grasps the outer unit 450 by fitting the pin insertion section 452 of the outer unit 450.

The inner catch section 334 grasps the inner unit 440. When the outer unit 450 includes a lock mechanism for holding the inner unit 440, the inner catch section 334 releases the lock provided in the inner unit 440 while grasping the inner unit 440, and sets the inner unit 440 to be movable with respect to the outer unit 450, and thereafter grasps the inner unit 440. The inner catch section 334 may have a shape that is the same as the shape of the inner wall of the opening 436 of the socket for adjustment 430, and grasps the inner unit 440 in response to the outer catch section 332 grasping the outer unit 450.

The actuator driving section 336 is fixed to the outer catch section 332, and moves the inner catch section 334. The actuator driving section 336 moves the inner catch section 334 in accordance with the amount of adjustment instructed by the actuator adjusting section 348. First, the actuator adjusting section 348 may set, as the initial position, the inner catch section 334 grasping the inner unit 440. Here, in an example, the initial position of the inner catch section 334 may be determined to position the inner unit 440 to the central portion on the outer unit 450.

The actuator adjusting section 348 can detect the positional difference of the initial position of the inner catch section 334 with respect to the outer catch section 332, by detecting the relative position between the reference mark 454 of the outer unit 450 and the reference mark 444 of the inner unit 440. In addition, the actuator adjusting section 348 drives the actuator 330 in the state fitting the actuator fitting unit 410, and adjusts the amount of driving of the actuator 330 in the case of adjusting the position of the device under test 12 on the device holder 30, based on the distance and direction in which the actuator 330 has actually moved.

That is, the actuator adjusting section 348 drives the inner catch section 334, and adjusts the amount of driving based on the distance and direction in which the inner catch section 334 has actually moved. Here, the actuator adjusting section 348 may detect the distance and direction in which the inner catch section 334 has actually moved, in accordance with the amount of moving of the inner catch section 334 from the initial position.

In addition, the actuator adjusting section 348 may detect the distance and direction in which the inner catch section 334 has actually moved, by comparing the image-capturing results of the actuator image-capturing section 326 and the socket-for-adjustment image-capturing section 322. That is, the actuator adjusting section 348 adjusts the amount of driving for the actuator 330, based on the amount of positional difference of the actuator fitting unit 410, between when the actuator fitting unit 410 fits the socket for adjustment 430 and when the actuator fitting unit 410 fits the actuator 330.

The control section 340 obtains the first correlation and the second correlation in the handler apparatus 100, and then detects the initial position, the moving distance, the direction, or the like of the actuator 330. Therefore, it becomes possible to reduce the variation, error, or the like of the relative position of the actuator 330 with respect to the test socket 122, thereby driving the actuator 330 with accuracy. The control section 340 may adjust each actuator 330 separately and independently, by detecting the initial position, moving distance, direction, and the like of the plurality of actuators 330 respectively.

In response to obtaining the first correlation, the second correlation, and the coordinates of the actuator 330, the handler apparatus 100 completes the adjustment by the tray for adjustment 20, and discharges the tray for adjustment 20 (S750). Then, the handler apparatus 100 carries in the device tray 10 mounting thereon the device under test 12 (S760). The control section 340 causes the device tray 10 to be carried in the heating section 210 by the carry-in loader.

Next, the handler apparatus 100 causes the device holder 30 to fit the socket for adjustment 430, and obtains the device coordinates being the relative position between the device under test 12 and the test socket 122 (S770). That is, the socket for adjustment 430 fits the device holder 30 prior to causing the test socket 122 fit the device holder 30 holding the device under test 12.

The socket-for-adjustment image-capturing section 322 captures an image of the socket for adjustment 430 and the device under test 12, in the state in which the device holder 30 fits the socket for adjustment 430. The socket-for-adjustment position detecting section 342 detects the relative position of the device under test 12 with respect to the socket for adjustment 430 based on the image-capturing result of the socket-for-adjustment image-capturing section 322.

Figure 25:
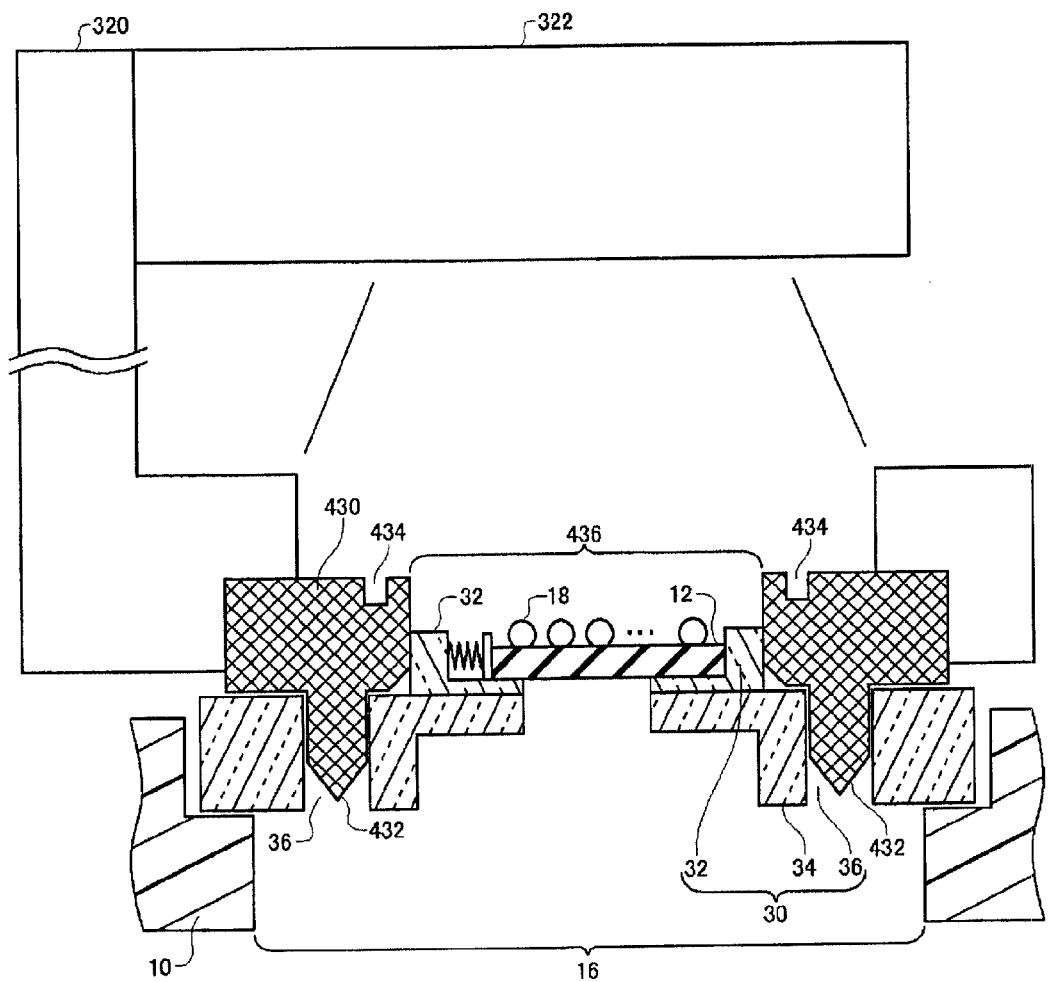
FIG. 25 an exemplary configuration in which the socket-for-adjustment image-capturing section 322 according to the present embodiment captures an image of the socket for adjustment 430 and a device holder 30 fitting each other.

FIG. 25 an exemplary configuration in which the socket-for-adjustment image-capturing section 322 according to the present embodiment captures an image of the socket for adjustment 430 and a device holder 30 fitting each other. The socket pin 432 fits the pin insertion section 36 of the outer unit 34, and the inner unit 32 is fixed by the inner wall of the opening 436 of the socket for adjustment 430. When the outer unit 34 includes a lock mechanism for holding the inner unit 32, the socket for adjustment 430 fits the outer unit 34 and releases the lock mechanism, to set the inner unit 32 to be movable, and then fixes the inner unit 32 by the inner wall of the opening 436.

The socket-for-adjustment image-capturing section 322 captures an image of the area including at least a part of the electrodes 18 of the device under test 12 and the reference mark 434 of the socket for adjustment 430, from the surface opposite to the surface of the socket for adjustment 430 fitting the device holder 30. The socket-for-adjustment position detecting section 342 detects the relative position of the electrodes 18 of the device under test 12 with respect to the socket for adjustment 430. Alternatively, the socket-for-adjustment position detecting section 342 may detect the relative position of the electrodes 18 of the device under test 12 with respect to the reference mark 434 of the socket for adjustment 430.

The socket-for-adjustment position detecting section 342 detects the relative position between the inner unit 32 and the test socket 122, based on the positional difference between the inner unit 440 of the actuator fitting unit 410 and the inner unit 32 of the device holder 30 caused between when the actuator fitting unit 410 fits the socket for adjustment 430 and when the device holder 30 fits the socket for adjustment 430. The socket-for-adjustment position detecting section 342 can detect the relative position between the electrodes 18 of the device under test 12 and the test socket 122, from the relative position between the inner unit 32 and the electrode 18 and the relative position between the inner unit 32 and the test socket 122.

That is, the socket-for-adjustment position detecting section 342 can obtain the device coordinates being the relative position between the electrode 18 of the device under test 12 and the electrode 126 of the test socket 122, when the device holder 30 fits the test socket 122. According to the device coordinates, the control section 340 can determine the position in which the device under test 12 is to be positioned on the device holder 30, so that the electrode 18 is electrically connected to the electrode 126, when the device holder 30 fits the test socket 122.

The conveyer 240 and/or the actuator unit 320 moves the device tray 10 so that the socket-for-adjustment position detecting section 342 can detect the relative positions between at least one actuator fitting unit 410 and the plurality of device holders 30 respectively. For example, the control section 340 controls the conveyer 240 and/or the actuator unit 320 to sequentially cause all the device holders 30 on the device tray 10 to fit the socket for adjustment 430, and determines the positions to which all the devices under test 12 are to be arranged.

Next, the handler apparatus 100 causes the device holder 30 to fit the actuator 330, and adjusts the position of the device under test 12 on the device holder 30 (S780). The control section 340 controls the conveyer 240 and/or the actuator unit 320 so that the device holder 30 aligned on a predetermined column of the device tray 10 fits the actuator 330 of the actuator unit 320.

The actuator adjusting section 348 obtains the correlation between the positions of the device holder 30 and the actuator fitting unit 410 from the detection result of the socket-for-adjustment position detecting section 342, and determines the adjusted position of the inner unit 32 (i.e., device under test 12) according to the device coordinates. That is, the actuator 330 adjusts the position of the device under test 12 on the device holder 30, based on the relative position of the device holder 30 with respect to the socket for adjustment 430 in the state in which the socket for adjustment 430 fits the device holder 30 and the relative position of the socket fitting unit 420 with respect to the socket for adjustment 430 in the state in which the socket for adjustment 430 fits the socket fitting unit 420.

Figure 26:
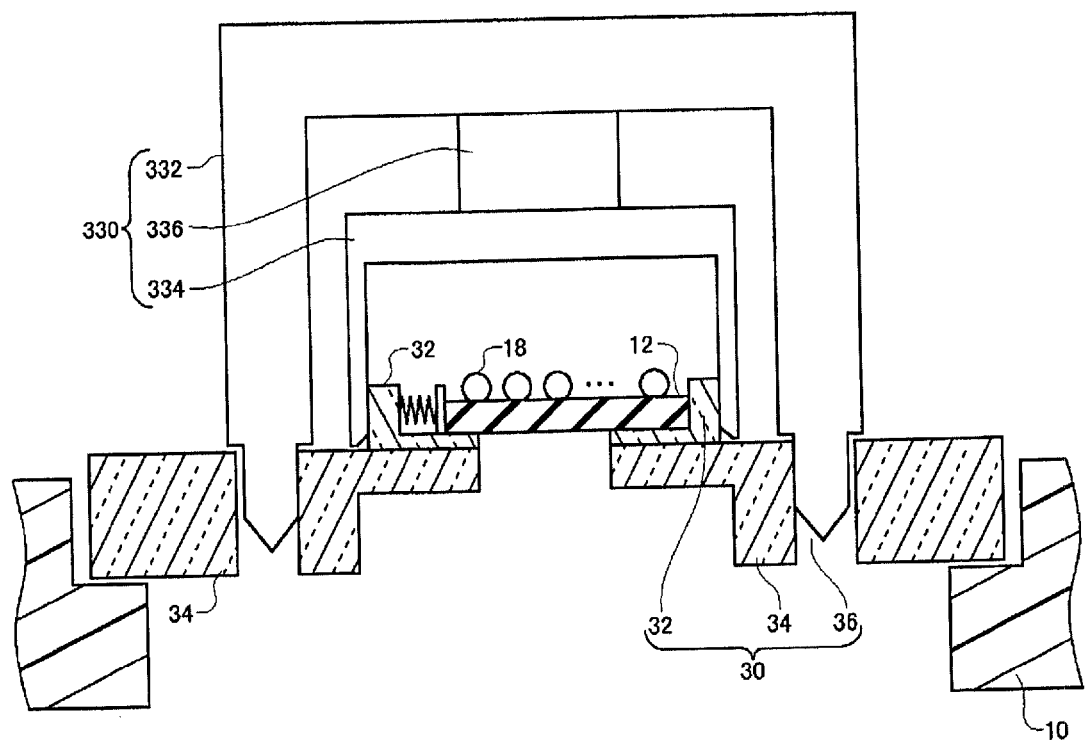
FIG. 26 shows an exemplary configuration in which the actuator 330 according to the present embodiment has fitted the device holder 30.

FIG. 26 shows an exemplary configuration in which the actuator 330 according to the present embodiment has fitted the device holder 30. The outer catch section 332 grasps the pin insertion section 36 of the device holder 30, as well as the inner catch section 334 grasping the inner unit 32. When the outer unit 34 includes a lock mechanism for holding the inner unit 32, the outer catch section 332 grasps the outer unit 34, as well as release the lock mechanism to make the inner unit 32 to be movable, and then the inner catch section 334 grasps the inner unit 32.

The inner catch section 334 is driven by the actuator driving section 336, to move the inner unit 32 to the adjusted position determined by the actuator adjusting section 348. In this way, the actuator 330 can adjust the position of the device under test 12 on the device holder 30, based on the amount of positional difference (i.e., device coordinates) of the device holder 30 to be caused between when the device holder 30 fits the test socket 122, and when the device holder 30 fits the socket for adjustment 430.

The control section 340 controls the actuator unit 320 so that the devices under test 12 on all the device holders 30 aligned in the predetermined columns of the device tray 10 are adjusted by the actuator 330. In addition, the control section 340 controls the conveyer 240 and/or the actuator unit 320 so that the devices under test 12 on the device holders 30 aligned in the other columns of the device tray 10 are adjusted by the actuator 330.

That is, the control section 340 sequentially moves the actuator unit 320 so that the actuators 330 can be positioned in predetermined positions respectively corresponding to the plurality of device holders 30. The actuator unit 320 sequentially moves the device holder 30 and the actuator 330 aligned in the column corresponding to the predetermined position to fit each other, each time it moves to the predetermined position on the device tray 10, and the actuator 330 adjusts the positions of the plurality of devices under test 12 held by the plurality of device holders 30 respectively.

Next, the handler apparatus 100 conveys the device under test 12 to the test section 220 (S790). Here, the handler apparatus 100 may convey the device under test 12 after heating the device under test 12 by the temperature control section 212. Alternatively, the handler apparatus 100 may heat the device under test 12 after the device tray 10 is carried in the heating section 210.

The conveyer 240 conveys the device holder 30 on which the position of the device under test 12 has been adjusted, to cause it to fit the test socket 122. Since the actuator 330 has adjusted the position of the device under test 12, the electrode 18 of the device under test 12 can be electrically connected to the electrode 126 of the test socket 122, as shown in FIG. 9.

Next, the test apparatus connected to the handler apparatus 100 executes a test of the device under test 12 (S800). The handler apparatus 100 discharges the device tray 10 in response to ending of the test (S810).

According to the handler apparatus 100 of the present embodiment described above, the relative position between the device under test 12 and the test socket 122 is detected and adjusted, prior to causing the device holder 30 holding the device under test 12 to fit the test socket 122, and therefore electrical connection between the test apparatus and the device under test 12 can be assured to a greater extent. In addition, prior to fitting of the actuator 330 and the device holder 30, the relative position, driving direction, and amount of driving of the actuator 330 are adjusted, which improves the position accuracy and the driving accuracy of the actuator, and it becomes possible to adjust the position of the device under test 12 with accuracy.

As described above, the handler apparatus 100 according to the present embodiment performs adjustment by means of the tray for adjustment 20, by obtaining the socket coordinates by causing the socket fitting unit 420 to fit the test socket 122, obtaining the first correlation by causing the socket fitting unit 420 to fit the socket for adjustment 430, obtaining the second correlation by causing the socket for adjustment 430 to fit the actuator fitting unit 410, and adjusting the actuator 330 by causing the actuator fitting unit 410 to fit the actuator 330, in the stated order. Alternatively, the handler apparatus 100 may perform adjustment while transporting the tray for adjustment 20 from the heating section 210 to the test section 220.

That is, the handler apparatus 100 carries the tray for adjustment 20 into the heating section 210, causes the socket for adjustment 430 to fit the actuator fitting unit 410, and subsequently causes the actuator fitting unit 410 to fit the actuator 330, thereby adjusting the actuator from the relative position between the actuator fitting unit 410 and the actuator 330. Then, the socket fitting unit 420 is caused to fit the socket for adjustment 430, and the relative position between the actuator fitting unit 410 and the socket fitting unit 420 is detected.

Next, the tray for adjustment 20 is conveyed to the test section 220, and the socket fitting unit 420 is caused to fit the test socket 122, and the first correlation and the second correlation are obtained. Accordingly, the handler apparatus 100 can execute the adjustment by the tray for adjustment 20, and therefore the tray for adjustment 20 can be discharged to outside of the handler apparatus 100 via the heat removing section 230. As stated above, the handler apparatus 100 can execute the adjustment by the tray for adjustment 20 appropriately, even when the order of detection of the relative position of each portion is changed.

In the handler apparatus 100 according to the present embodiment, both of the relative position of the device under test 12 with respect to the socket for adjustment 430 and the relative position of the test socket 122 with respect to the socket fitting unit 420 are detected so as to detect the amount of positional difference between the device under test 12 and the test socket 122. When one of the above-described relative positions is known, the handler apparatus 100 may omit detection of the other of the above-described relative positions. For example, the handler apparatus 100 may omit detection of the relative position of the test socket 122 from the subsequent test, by using the already detected relative position of the test socket 122 from the subsequent test of the device tray 10. It is also possible to omit one of the detection of the above-described relative positions, by using information on the relative position inputted by a user or the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. An actuator for adjusting a position of a device under test, comprising:
    a fixed section;
    first, second, and third rotation axes provided at the fixed section and having axes in a same direction;
    first, second, and third rotation sections provided in correspondence to the first, second, and third rotation axes, provided at positions offset from centers of the corresponding rotation axes, and rotating in response to rotation of the corresponding rotation axes;
    a movable section including first and third side walls facing the first and the third rotation sections in a first direction on a predetermined movable plane, and a second side wall facing the second rotation section in a second direction different from the first direction, the movable section moving on the movable plane with respect to the fixed section in response to rotation of the first, second, and third rotation sections, and adjusting a position of the device under test; and
    a biasing section biasing the movable section with respect to the fixed section in at least one of the first direction and the second direction, and making at least one of the first, second, and third rotation sections abut against the corresponding side wall.

2. The actuator according to claim 1, wherein
    the biasing section biases the movable section with respect to the fixed section in both of the first direction and the second direction, and makes the first, second, and third rotation sections abut against the first, second, and third side walls.

3. The actuator according to claim 2, wherein
    the movable section moves while the first, second, and third side walls abut against the first, second, and third rotation sections.

4. The actuator according to claim 3, wherein
    the biasing section includes:
    a spring in a first direction whose one end is connected to the fixed section and the other end is connected to the movable section, the spring in the first direction applying tension force between the fixed section and the movable section in the first direction; and
    a spring in a second direction whose one end is connected to the fixed section and the other end is connected to the movable section, the spring in the second direction applying tension force between the fixed section and the movable section in the second direction.

5. The actuator according to claim 1, wherein
    the first direction is orthogonal to the second direction.

6. The actuator according to claim 1, further comprising:
    first, second, and third motors including rotation axes in a direction parallel to the movable plane; and
    first, second, and third converting sections provided to correspond to the first, second, and third motors, converting rotation of the corresponding motors to rotation having an axis in a vertical direction with respect to the movable plane, and rotating the first, second, and third rotation axes.

7. A handler apparatus for conveying a device under test to a test socket, comprising:
    the actuator according to claim 1, prior to causing a device holder holding the device under test to fit the test socket, adjusting a position of the device under test on the device holder; and
    a conveyer conveying the device holder on which the position of the device under test has been adjusted, to cause the device holder to fit the test socket.

8. The handler apparatus according to claim 7, further comprising:
    an image-capturing section capturing an image of the actuator; and
    an actuator adjusting section identifying a center of a rotational operation of the actuator based on an image-capturing result captured by the image-capturing section while rotating the movable section of the actuator on the movable plane.

9. The handler apparatus according to claim 8, wherein
    the actuator includes a mark on a driving portion, the image-capturing section captures an image of an area including the mark, and the actuator adjusting section identifies the center of the rotational operation of the actuator based on movement of the mark in response to rotation of the actuator.

10. The handler apparatus according to claim 8, further comprising an actuator fitting unit to fit a driving portion of the actuator and including a mark, wherein the image-capturing section captures an image of an area including the mark, and the actuator adjusting section identifies the center of the rotational operation of the actuator based on movement of the mark in response to rotation of the actuator.

11. The handler apparatus according to claim 9, wherein the actuator adjusting section detects an arc approximating an orbit on which the mark has moved in response to rotation of the actuator, and identifies the center of the arc.

12. The handler apparatus according to claim 8, wherein the movable section of the actuator moves according to an instruction to move in a predetermined direction on the movable plane, and the actuator adjusting section identifies a direction in which the actuator moves according to the instruction, based on the image-capturing result of the image-capturing section when the movable section of the actuator moved according to the instruction.

13. A test apparatus comprising the handler apparatus according to claim 7 for conveying the device under test to a test socket, the test apparatus testing the device under test and further comprising:

a test head to be electrically connected to the device under test via the test socket; and a test module testing the device under test via the test head.

* * * * *